(12) United States Patent
Park et al.

(10) Patent No.: US 12,532,741 B2
(45) Date of Patent: Jan. 20, 2026

(54) SEMICONDUCTOR DEVICES AND METHODS OF MANUFACTURING SEMICONDUCTOR DEVICES

(71) Applicant: Amkor Technology Singapore Holding Pte. Ltd., Singapore (SG)

(72) Inventors: Dong Hyeon Park, Seoul (KR); Yun Ah Kim, Gyeonggi-do (KR); Seok Ho Na, Incheon (KR); Won Ho Choi, Incheon (KR); Dong Su Ryu, Incheon (KR); Jo Hyun Bae, Incheon (KR); Min Jae Kong, Seoul (KR); Jin Young Khim, Seoul (KR); Jae Yeong Bae, Incheon (KR); Dong Hee Kang, Gyeonggi-Do (KR)

(73) Assignee: Amkor Technology Singapore Holding Pte. Ltd., Singapore (SG)

( * ) Notice: Subject to any disclaimer, the term of this patent is extended or adjusted under 35 U.S.C. 154(b) by 518 days.

(21) Appl. No.: 17/985,476

(22) Filed: Nov. 11, 2022

(65) Prior Publication Data

US 2024/0162113 A1 May 16, 2024

(51) Int. Cl.
| | |
|---|---|
| *H01L 21/52* | (2006.01) |
| *H01L 21/56* | (2006.01) |
| *H01L 23/00* | (2006.01) |
| *H01L 23/053* | (2006.01) |
| *H01L 23/367* | (2006.01) |
| *H01L 23/42* | (2006.01) |
| *H01L 23/498* | (2006.01) |

(52) U.S. Cl.
CPC .............. *H01L 23/42* (2013.01); *H01L 21/52* (2013.01); *H01L 21/563* (2013.01); *H01L 23/053* (2013.01); *H01L 23/3672* (2013.01); *H01L 23/49822* (2013.01); *H01L 23/562* (2013.01); *H01L 24/16* (2013.01); *H01L 24/32* (2013.01); *H01L 24/73* (2013.01); *H01L 2224/16227* (2013.01); *H01L 2224/32225* (2013.01); *H01L 2224/73204* (2013.01)

(58) Field of Classification Search
CPC ... H01L 23/42; H01L 23/053; H01L 23/3672; H01L 23/49822; H01L 23/562; H01L 24/16; H01L 24/32; H01L 24/73; H01L 2224/16227; H01L 2224/32225; H01L 2224/73204
See application file for complete search history.

(56) References Cited

U.S. PATENT DOCUMENTS

2006/0273451 A1* 12/2006 Kawabata ............... H01L 24/82
257/E23.092
2009/0166830 A1* 7/2009 Li .......................... H01L 23/04
257/E23.191

(Continued)

*Primary Examiner* — Peniel M Gumedzoe
(74) *Attorney, Agent, or Firm* — Spectrum IP Law Group LLC

(57) ABSTRACT

In one example, an electronic device comprises a substrate comprising a conductive structure and an inner side and an outer side, a first electronic component over the inner side of the substrate and coupled with the conductive structure, a lid over the substrate and the first electronic component and comprising a first hole in the lid, and a thermal interface material between the first electronic component and the lid. The thermal interface material is in the first hole. Other examples and related methods are also disclosed herein.

14 Claims, 20 Drawing Sheets

(56) References Cited

U.S. PATENT DOCUMENTS

| | | | | |
|---|---|---|---|---|
| 2011/0018125 A1* | 1/2011 | Loo | ............... | H01L 23/16 |
| | | | | 257/E23.101 |
| 2015/0279761 A1* | 10/2015 | Bet-Shliemoun | ....... | H01L 23/42 |
| | | | | 257/714 |
| 2021/0305227 A1* | 9/2021 | Chen | ............... | H01L 25/18 |
| 2021/0407887 A1* | 12/2021 | Yu | ............... | H01L 23/3157 |

* cited by examiner

SEMICONDUCTOR DEVICES AND METHODS OF MANUFACTURING SEMICONDUCTOR DEVICES

TECHNICAL FIELD

The present disclosure relates, in general, to electronic devices, and more particularly, to semiconductor devices and methods for manufacturing semiconductor devices.

BACKGROUND

Prior semiconductor packages and methods for forming semiconductor packages are inadequate, resulting in, for example, excess cost, decreased reliability, relatively low performance, or package sizes that are too large. Further limitations and disadvantages of conventional and traditional approaches will become apparent to one of skill in the art, through comparison of such approaches with the present disclosure and reference to the drawings.

Figure 1:
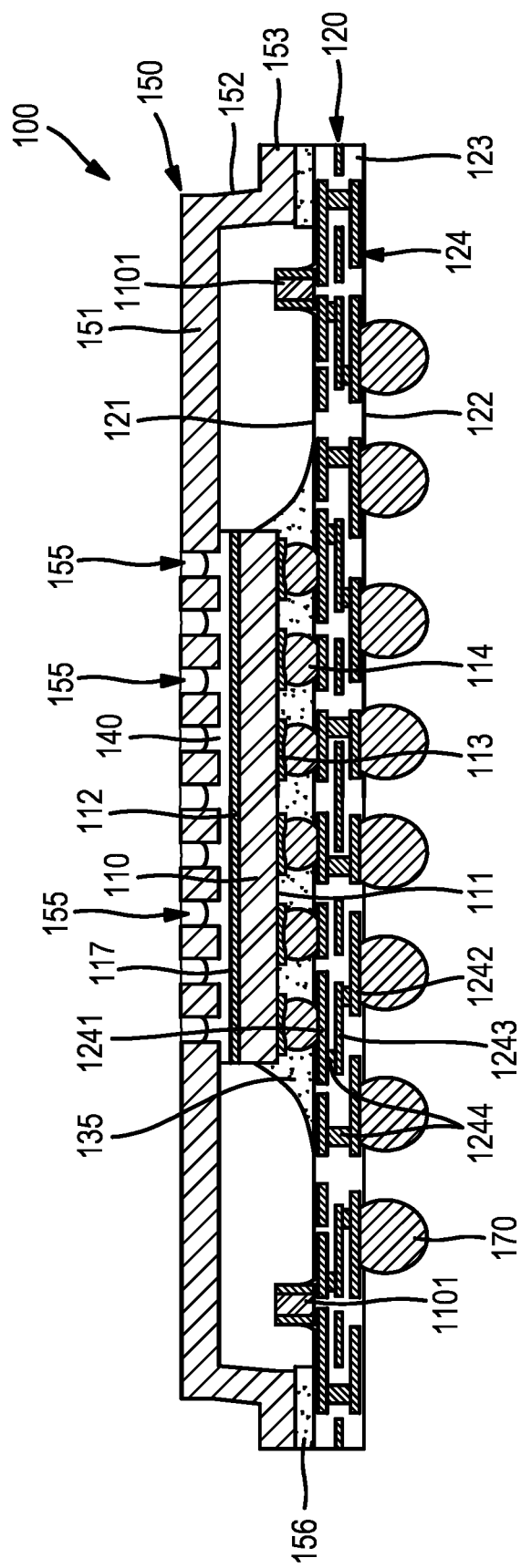
FIG. 1 shows a cross-sectional view of an example electronic device.

The following discussion provides various examples of semiconductor devices and methods of manufacturing semiconductor devices. Such examples are non-limiting, and the scope of the appended claims should not be limited to the particular examples disclosed. In the following discussion, the terms "example" and "e.g." are non-limiting.

The figures illustrate the general manner of construction, and descriptions and details of well-known features and techniques can be omitted to avoid unnecessarily obscuring the present disclosure. In addition, elements in the figures are not necessarily drawn to scale. For example, the dimensions of some of the elements in the figures can be exaggerated relative to other elements to help enhance understanding of the examples discussed in the present disclosure.

The term "or" means any one or more of the items in the list joined by "or". As an example, "x or y" means any element of the three-element set {(x), (y), (x, y)}. As another example, "x, y, or z" means any element of the seven-element set {(x), (y), (z), (x, y), (x, z), (y, z), (x, y, z)}. The terms "comprises," "comprising," "includes," or "including," are "open ended" terms and specify the presence of stated features, but do not preclude the presence or addition of one or more other features.

The terms "first," "second," etc. can be used herein to describe various elements, and these elements should not be limited by these terms. These terms are only used to distinguish one element from another. Thus, for example, a first element discussed in this disclosure could be termed a second element without departing from the teachings of the present disclosure.

Unless specified otherwise, the term "coupled" can be used to describe two elements directly contacting each other or describe two elements indirectly coupled by one or more other elements. For example, if element A is coupled to element B, then element A can be directly contacting element B or indirectly coupled to element B by an intervening element C. Coupled can refer to an electrical coupling or a mechanical coupling. Similarly, the terms "over" or "on" can be used to describe two elements directly contacting each other or describe two elements indirectly coupled by one or more other elements.

Crosshatching lines can be used throughout the figures to denote different parts but not necessarily to denote the same or different materials. Throughout the present disclosure, like reference numbers denote like elements. Accordingly, elements with like element numbering can be shown in the figures but cannot be necessarily repeated herein for the sake of clarity.

DESCRIPTION

In one example, an electronic device comprises a substrate comprising a conductive structure and an inner side and an outer side. a first electronic component over the inner side of the substrate and coupled with the conductive structure, a lid over the substrate and the first electronic component and comprising a first hole in the lid, and a thermal interface material between the first electronic component and the lid. The thermal interface material is in the first hole.

In another example, an electronic device comprises a substrate comprising a dielectric structure and a conductive structure and having a top side, an electronic component over the top side of the substrate and coupled with the conductive structure, a metallization layer on a backside of the electronic component, and a stiffener coupled with the top side of the substrate.

In yet another example, a method to manufacture an electronic device comprises providing an electronic component comprising a semiconductor die having an inner side, and a conductive structure provided over the inner side of the semiconductor die, providing a metallization layer on a backside of the electronic component, the backside of the electronic component being opposite the inner side of the semiconductor die, and providing a lid over the electronic component, the metallization layer being oriented toward the lid.

Other examples are included in the present disclosure. Such examples can be found in the figures, in the claims, or in the description of the present disclosure.

FIG. 1 shows a cross-sectional view of an example electronic device 100. In the example shown in FIG. 1, electronic device 100 can comprise electronic component 110, substrate 120, interface material 135, thermal interface material (TIM) 140, lid 150, lid adhesive 156, and external terminals 170. In some examples, electronic device 100 can also include one or more electronic components 1101.

Electronic component 110 can comprise component inner side 111, component backside 112, component contact pads 113, connectors 114, and metallization layer 117. Metallization layer 117 can be on the backside 112 of electronic component 110 facing lid 150 and can contact TIM 140. Substrate 120 can comprise substrate inner side 121, substrate outer side 122, dielectric structure 123, and conductive structure 124. Electronic component 110 can be over substrate inner side 121 and can be coupled with conductive structure 124. Conductive structure 124 can comprise inner terminals 1241, outer terminals 1242, traces 1243, and vias 1244. Lid 150 can comprise lid top 151, lid wall 152, and lid foot 153 and can be over substrate 120 and electronic component 110. Lid wall 152 can extend from a lateral end of lid 150 and can be coupled with inner side 121 of substrate 120. Lid top 151 can comprise and define at least one or a plurality of capillary holes 155 formed in lid 150. TIM 140 can be between electronic component 110 and lid 150 can be in one or more of the plurality of capillary holes 155. Lid wall 152 extends from lid top 151 toward substrate 120. Lid foot 153 is located at the end of lid wall 152 opposite lid top 151. Lid foot 153 extends from lid wall 152 in a direction generally parallel to lid top 151 or substrate inner side 121. Lid wall 152 can define a cavity or space between lid wall and electronic component 110.

Substrate 120, interface material 135, TIM 140, lid 150, and external terminals 170 can be referred to as a semiconductor package and can protect electronic component 110 from external elements. The semiconductor package can provide coupling between external components and electronic component 110.

Figure 2A:
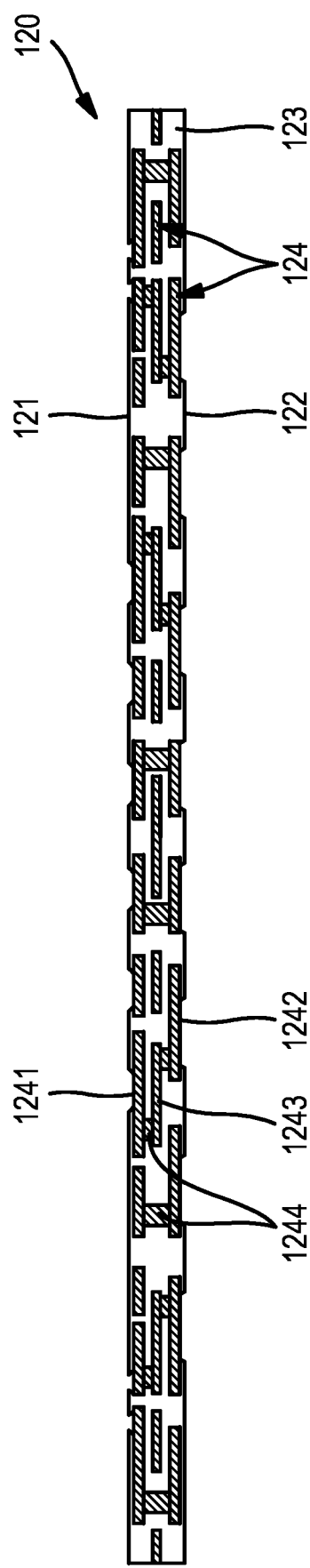
FIGS. 2A to 2E show cross-sectional views of an example method for manufacturing an example electronic device.

FIGS. 2A to 2E show cross-sectional views of an example method for manufacturing electronic device 100. FIG. 2A shows a cross-sectional view of electronic device 100 at an early stage of manufacture.

In the example shown in FIG. 2A, substrate 120 can be provided. Substrate 120 can comprise or be referred to as a rigid printed circuit board, a flexible printed circuit board, a laminate substrate, a redistribution layer (RDL) substrate, a coreless substrate, a ceramic substrate, a glass substrate, a silicon substrate, or a package substrate. Substrate 120 can couple electronic component 110, for example as shown in FIG. 1, to an external device or to other electronic components of electronic device 100.

Substrate 120 can comprise substrate inner side 121 and substrate outer side 122. Substrate outer side 122 is opposite and oriented away from substrate inner side 121. Substrate 120 further comprises dielectric structure 123 and conductive structure 124. Electronic component 110 and lid 150 can be attached to substrate inner side 121. External terminals 170 can be attached to substrate outer side 122. In some examples, the thickness of substrate 120, as measured between substrate inner side 121 and substrate outer side 122, can range from approximately 40 micrometers (μm) to approximately 1000 μm.

Dielectric structure 123 can comprise or be referred to as one or more dielectric layers. Dielectric structure 123 can comprise FR4 (a laminate of copper foil-glass fiber fabric-copper foil), bismaleimide triazine (BT), polyimide (PI), benzocyclobutene (BCB), polybenzoxazole (PBO), or ceramic. In some examples, the thickness of dielectric structure 123 can range from approximately 3 μm to approximately 100 μm. In some examples, the thickness of dielectric structure 123 can refer to individual layers of dielectric structure 123. In some examples, the combined thickness of all layers of dielectric structure 123 can be similar or equal to the thickness of substrate 120. Dielectric structure 123 can maintain the shape of substrate 120 and can also support conductive structure 124.

Conductive structure 124 can comprise or be referred to as one or more conductive layers, traces, pads, patterns, under bumped metallization (UBM). Conductive structure 124 can comprise copper, aluminum, gold, silver, nickel, palladium, or an alloy. In some examples, the thickness of conductive structure 124 can range from approximately 3 μm to approximately 50 μm. In some examples, the thickness of conductive structure 124 can refer to individual layers of conductive structure 124. Conductive structure 124 can provide electrical signal paths, for example vertical paths and horizontal paths, for electronic component 110.

Conductive structure 124 can further comprise inner terminals 1241, outer terminals 1242, traces 1243, and vias 1244. Inner terminals 1241 can be provided on the inner side of dielectric structure 123, for example on inner side 121 of substrate 120. Inner terminals 1241 can be exposed from dielectric structure 123. For example, openings provided in dielectric structure 123 are located over and expose at least a portion of inner terminals 1241. Inner terminals 1241 can be coupled to traces 1243 or vias 1244. Inner terminals 1241 can comprise or be referred to as a trace, a bond finger, a land, or a pad. Inner terminals 1241 can comprise copper, aluminum, gold, silver, nickel, palladium, or an alloy. In some examples, the thickness of each inner terminal 1241 can range from approximately 3 μm to approximately 50 μm. Electronic component 110 can be coupled to inner terminals 1241.

Outer terminals 1242 can be provided on the outer side of dielectric structure 123, for example on outer side 122 of substrate 120. Outer terminals 1242 can be exposed from dielectric structure 123. For example, openings provided in dielectric structure 123 are located over and expose at least a portion of outer terminals 1242. Outer terminals 1242 can be coupled to traces 1243 or vias 1244. Outer terminals 1242 can be referred to as or comprise a trace, a pad, or a ball land. Outer terminal 1242 can comprise copper, aluminum, gold, silver, nickel, palladium, or an alloy. In some examples, the thickness of outer terminal 1242 can range from approximately 3 μm to approximately 50 μm. In some examples, external terminal 170 can be coupled to outer terminal 1242 in a later process.

Embedded trace 1243 optionally can be provided in a form extending in a generally horizontal direction inside dielectric structure 123. Embedded trace 1243 can guide an electrical connection path in an approximately horizontal direction inside dielectric structure 123, and can be coupled to inner terminal 1241, outer terminal 1242, or embedded via 1244. In some examples, the thickness of embedded trace 1243 can range from approximately 3 μm to approximately 50 μm. Embedded via 1244 optionally can be provided in a form extending in a substantially vertical direction inside dielectric structure 123. Embedded via 1244 can guide an electrical connection path in an approximately vertical direction inside dielectric structure 123 and can be coupled to inner terminal 1241, outer terminal 1242, or embedded trace 1243. In some examples, the width of embedded via 1244 can range from approximately 3 μm to approximately 50 μm.

In some examples, substrate 120 can be a pre-formed substrate. The pre-formed substrate can be manufactured prior to attachment to an electronic device and can comprise dielectric layers between respective conductive layers. The conductive layers can comprise copper and can be formed using an electroplating process. The dielectric layers can be non-photo-definable layers and can be attached as a pre-formed film rather than as a liquid and can include a resin with fillers such as strands, weaves, or other inorganic particles for rigidity or structural support. Since the dielectric layers are non-photo-definable, features such as vias or openings can be formed using a drill or laser. In some examples, the dielectric layers can comprise a prepreg material or Ajinomoto Buildup Film (ABF). The pre-formed substrate can include a permanent core structure or carrier such as, for example, a dielectric material comprising bismaleimide triazine (BT) or FR4, and dielectric and conductive layers can be formed on the permanent core structure. In other examples, the pre-formed substrate can be a coreless substrate omitting the permanent core structure, and the dielectric and conductive layers can be formed on a sacrificial carrier that is removed after formation of the dielectric and conductive layers and before attachment to the electronic device. The pre-formed substrate can be referred to as a printed circuit board (PCB) or a laminate substrate. Such pre-formed substrate can be formed through a semi-additive or modified-semi-additive process.

In other examples, substrate 120 can be a redistribution layer (RDL) substrate. RDL substrates can comprise one or more conductive redistribution layers and one or more dielectric layers that (a) can be formed layer by layer over an electronic device to which the RDL substrate is to be coupled, or (b) can be formed layer by layer over a carrier that can be removed after the electronic device is coupled to the RDL substrate. RDL substrates can be manufactured layer by layer as a wafer-level substrate on a round wafer in a wafer-level process, or as a panel-level substrate on a rectangular or square panel carrier in a panel-level process. RDL substrates can be formed in an additive buildup process that can include one or more dielectric layers alternatingly formed with one or more conductive layers that define respective conductive redistribution patterns or traces configured to collectively (a) fan-out electrical traces outside the footprint of the electronic device, or (b) fan-in electrical traces within the footprint of the electronic device. The conductive patterns can be formed using a plating process such as, for example, an electroplating process or an electroless plating process. The conductive patterns can comprise an electrically conductive material such as, for example, copper or other plateable metal. The locations of the conductive patterns can be made using a photo-patterning process such as, for example, a photolithography process and a photoresist material to form a photolithographic mask. The dielectric layers of the RDL substrate can be patterned with a photo-patterning process, which can include a photolithographic mask through which light is exposed to photo-pattern desired features such as vias in the dielectric layers. Thus, the dielectric layers can be made from photo-definable organic dielectric materials such as, for example, polyimide (PI), benzocyclobutene (BCB), or polybenzoxazole (PBO). Such dielectric materials can be spun-on or otherwise coated in liquid form, rather than attached as a pre-formed film. To permit proper formation of desired photo-defined features, such photo-definable dielectric materials can omit structural reinforcers or can be filler-free, without strands, weaves, or other particles that could interfere with the light from the photo-patterning process. In some examples, such filler-free characteristics of filler-free dielectric materials can permit a reduction of the thickness of the resulting dielectric layer. Although the photo-definable dielectric materials described above can be organic materials, in other examples the dielectric materials of the RDL substrates can comprise one or more inorganic dielectric layers. Some examples of one or more inorganic dielectric layers can comprise silicon nitride (Si3N4), silicon oxide (SiO2), or silicon oxynitride (SiON). The one or more inorganic dielectric layers can be formed by growing the inorganic dielectric layers using an oxidation or nitridization process instead using photo-defined organic dielectric materials. Such inorganic dielectric layers can be filler-fee, without strands, weaves, or other dissimilar inorganic particles. In some examples, the RDL substrates can omit a permanent core structure or carrier such as, for example, a dielectric material comprising bismaleimide triazine (BT) or FR4 and these types of RDL substrates can be referred to as a coreless substrate.

Figure 2B:
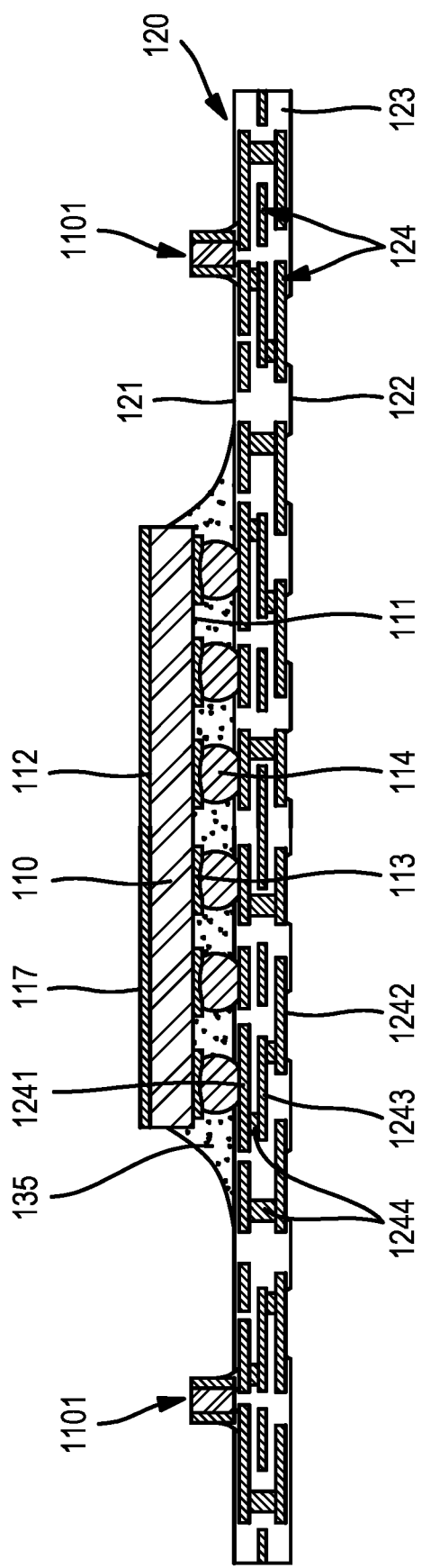

FIG. 2B shows a cross-sectional view of electronic device 100 at a later stage of manufacture. In the example shown in FIG. 2B, electronic component 110 can be provided over inner side 121 of substrate 120. Electronic component 110 can be coupled to conductive structure 124 of substrate 120. In some examples, one or more electronic components 1101 can also be provided over inner side 121 of substrate 120. Electronic components 1101 can be coupled to conductive structure 124 of substrate 120.

Electronic component 110 can comprise component inner side 111 and component backside 112. Inner side 111 can comprise an active side of electronic component 110. Component inner side 111 is opposite and oriented away from component backside 112. Component inner side 111 can be oriented toward inner side 121 of substrate 120. Electronic component 110 can also comprise contact pads 113 provided over component inner side 111. Contact pads 113 can comprise or be referred to as bond pads. Contact pads 113 can be exposed through an inorganic dielectric layer, such as SiO2 or Si3N4, or can be exposed through an organic dielectric layer. Electronic component 110 can also comprise connectors 114. Connectors 114 can be coupled to contact pads 113. Connectors 114 can comprise or be referred to as bumps, posts, pillars, or stud bumps.

In some examples, electronic component 110 can comprise metallization layer 117. Metallization layer 117 can be provided on backside 112 of electronic component 110.

Connectors 114 can couple electronic component 110 to inner terminals 1241 of substrate 120. In some examples, connectors 114 of the electronic component 110 can be coupled to inner terminal 1241 of substrate 120 using a reflow process, a thermal ultrasonic compression process, or a laser assisted bonding process. Electronic component 110 can comprise or be referred to as a semiconductor die, a semiconductor chip, a semiconductor package, a semiconductor device, an active component, or a passive component. Electronic component 110 can comprise a digital signal processor (DSP), a network processor, a power management unit, an audio processor, a wireless baseband system on a chip (SoC) processor, a sensor, an application specific integrated circuit (ASIC), a memory, an antenna on package (AoP), an antenna in package (AiP), a Fifth Generation (5G) New Radio (NR) mm-Wave module, a sub-6 GHz radio-frequency (RF) module, or an integrated passive device (IPD). In some examples, electronic component 110 can comprise a relatively large active component, as compared to electronic components 1101, and can be attached to a generally central region of substrate 120. In some examples, one or more electronic components 1101 can comprise a passive device, for example a capacitor, resistor, multi-layer ceramic capacitor, and so on. In various examples, one or more electronic components 1101 can each comprise a relatively small passive component, as compared to electronic component 110, and can be attached to a peripheral region of substrate 120. In some examples, the thickness of electronic component 110, as measured between inner side 111 and backside 112, can range from approximately 40 μm to approximately 1000 μm.

In some examples, interface material 135 can be provided between substrate 120 and electronic component 110. Interface material 135 can comprise or be referred to as a capillary underfill, a no-flow underfill, also called a non-conductive paste (NCP), a wafer level underfill, also called a B-stage underfill, a molded underfill (MUF), a non-conductive film (NCF), or an anisotropic conductive film (ACF).

In some examples, interface material 135 can be injected between electronic component 110 and substrate 120, after electronic component 110 is coupled to substrate 120, for example interface material 135 can be capillary underfill. In some examples, interface material 135 can be applied to substrate 120, prior to attaching electronic component 110 to substrate 120, for example interface material 135 can comprise a no-flow underfill. In some examples, interface material 135 can be applied over connectors 114 and inner surface 111 of electronic component 110, prior to coupling electronic component 110 to substrate 120, for example interface material 135 can comprise a wafer level underfill. In some examples, interface material 135 can fill the gap between electronic component 110 and substrate 120 and can wrap around the lateral sides of electronic component 110, for example interface material 135 can comprise a molded underfill. In some examples, interface material 135 can be positioned on inner terminals 1241 of substrate 120 in the form of a film, connectors 114 can be pressed through interface material 135 and into contact with inner terminals 1241, and then a reflow process of connectors 114 and an underfill curing process can be simultaneously performed, for example interface material 135 can comprise a non-conductive film (NCF).

Interface material 135 can be positioned between electronic component 110 and substrate 120 to surround connectors 114. Interface material 135 can redistribute stress or strain generated due to a difference between the coefficient of thermal expansion (CTE) of electronic component 110, for example a CTE of about 2-4 ppm/° C. and the coefficient of thermal expansion of substrate 120, for example a CTE of about 20-30 ppm/° C. Interface material 135 can prevent, or reduce, moisture penetration, can prevent, or reduce, transmission of physical or chemical impact to electronic component 110, and can transfer heat generated by electronic component 110. In some examples, metallization layer 117 can be formed over backside 112 of electronic component 110 after attaching electronic component 110 to substrate 120.

Figure 2C:
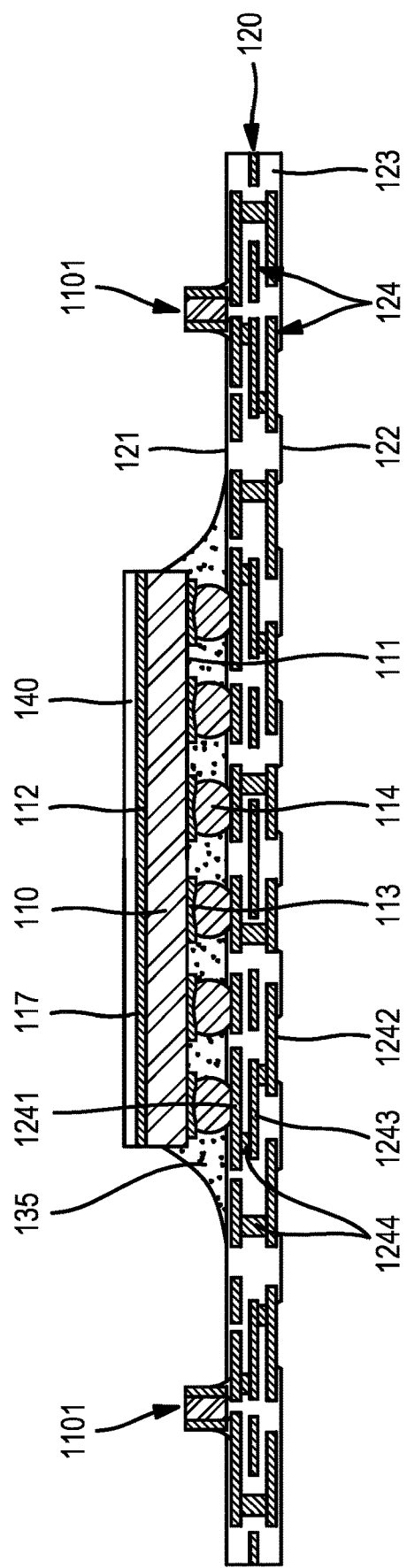

FIG. 2C shows a cross-sectional view of electronic device 100 at a later stage of manufacture. In the example shown in FIG. 2C, TIM 140 can be provided. TIM 140 can be provided over component backside 112 of electronic component 110. In some examples, TIM 140 can be provided on metallization layer 117. In some examples, TIM 140 can be applied directly to backside 112 of electronic component 110 wherein metallization layer 117 can be eliminated or absent from electronic device 100 in some examples.

TIM 140 can comprise or be referred to as a metallic TIM, a polymer TIM, a thermal grease, a thermal gel, a polymer filled with conductive powder, a phase change thermal material, pure indium, an indium alloy, indium tin, an indium tin alloy, a compressible soft metal, a gap-filler pad, a soft thermal pad, solder, or solder alloy. In some examples, the area or footprint of TIM 140 can be smaller than the area or footprint of electronic component 110. In some examples, the area or footprint of TIM 140 can be equal to, or approximately equal to, the area or footprint of electronic component 110.

TIM 140 can be applied by printing, injecting, spraying, coating, or plating. In some examples, TIM 140 can be a preformed film or sheet, which can be located over backside 112. In some examples, the thickness of TIM 140 can range from approximately 10 μm to approximately 1000 μm.

Figure 2D:
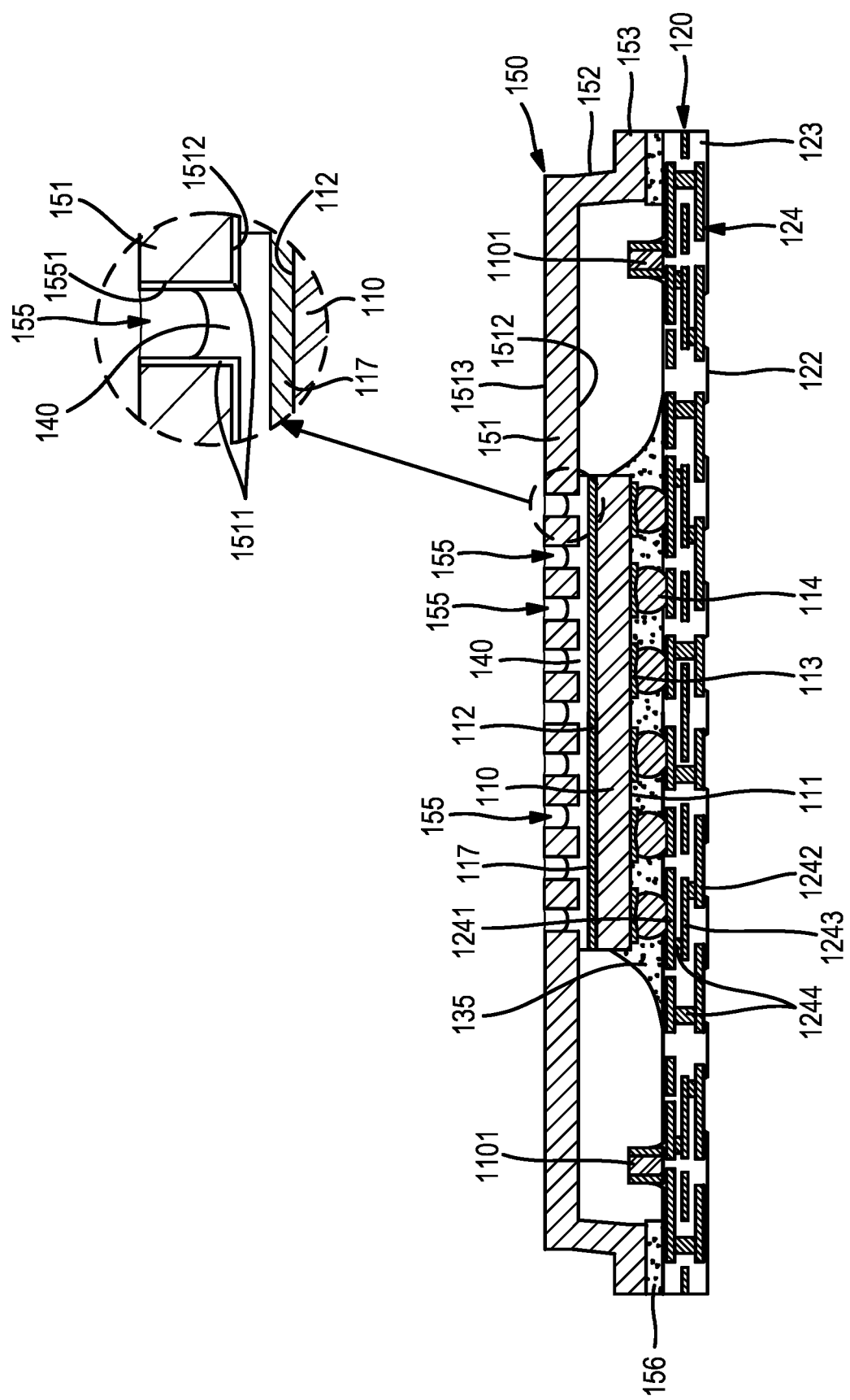

FIG. 2D shows a cross-sectional view of electronic device 100 at a later stage of manufacture. In the example shown in FIG. 2D, lid 150 can be provided. Lid 150 can be positioned on substrate 120 and over electronic component 110. In some examples, lid 150 can cover electronic component 110. Lid 150 can comprise or be referred to as a cover, a cap, a housing, a heat spreader, a heat sink, a shield, or a stiffener. Lid 150 can comprise aluminum, copper, an aluminum-silicon-carbide (AlSiC) composite, or a copper-tungsten (CuW) composite. In some examples, the thickness of lid 150, as measured from substrate upper side 121, can range from approximately 100 μm to approximately 1000 μm. Lid 150 can protect electronic component 110 from an external environment, can dissipate or transfer heat generated by electronic component 110, or provide shielding, for example electromagnetic shielding.

Lid 150 can comprise lid top 151, lid wall 152, and lid foot 153. Lid top 151 can be provided to have a substantially planar shape. In some examples, lid top 151 can comprise and define a plurality of capillary holes 155. Capillary holes 155 can be arranged in a portion of lid top 151 corresponding to TIM 140. For example, capillary holes 155 can be located directly over TIM 140, for example capillary holes 155 can be overlapping over TIM 140. Capillary holes 155 can extend completely through lid top 151. Capillary holes 155 can be referred to as openings or apertures. In some examples, capillary holes 155 can each have a diameter in a range of approximately 10 μm to approximately 500 μm. During attachment of lid 150, lid top 151 can be pressed into contact with TIM 140. In some examples, lid top 151 can be pressed into contact with metallization layer 117 during attachment of lid 150. In some examples, TIM 140 or metallization layer 117 can flow into capillary holes 155 during attachment of lid 150. TIM 140 or metallization layer 117 flowing into capillary holes 155 tends to prevent or reduce the flow of TIM 140 outside the footprint of electronic component 110 or to inner side 121 of substrate 120. TIM 140 or metallization layer 117 flowing into capillary holes 155 can also reduce or prevent formation of voids, areas devoid of material, in TIM 140 or metallization layer 117. TIM 140 or metallization layer 117 can fill all or part of one or more capillary holes 155. In some examples, the depth to which TIM 140 fills capillary holes 155 can be controlled according to the pressure applied to lid 150 during attachment of lid 150.

In some examples, to enhance wetting of TIM 140 or metallization layer 117, wettability enhancing layer 1511 can be provided on the lower surface 1512 of lid top 151 or the walls 1551 of capillary holes 155. In some examples, wettability enhancing layer 1511 can comprise gold, silver, nickel, palladium, or vanadium. In some examples, the thickness of wettability enhancing layer 1511 can range from approximately 0.01 μm to approximately 10 μm. Wettability enhancing layer 1511 can enhance the flow of TIM 140 or metallization layer 117 into capillary holes 155, which tends to reduce or prevent flow-out phenomenon and an air void generation phenomenon in TIM 140 or metallization layer 117.

In some examples, lid top 151 can comprise trenches, protrusions, or fins formed on upper surface 1513 of lid top 151 to further enhance thermal performance. Lid wall 152 can extend from the periphery, for example the perimeter, of lid top 151 toward substrate 120. Lid wall 152 can be oriented at a non-right angle relative to lid top 151 or oriented at a right angle relative to lid top 151. Lid foot 153 can be provided at the bottom end of lid wall 152 and can be attached to substrate 120 via adhesive 156. Lid foot 153 can be oriented and extended in a direction substantially parallel to the upper side 121 of substrate 120.

Figure 2E:
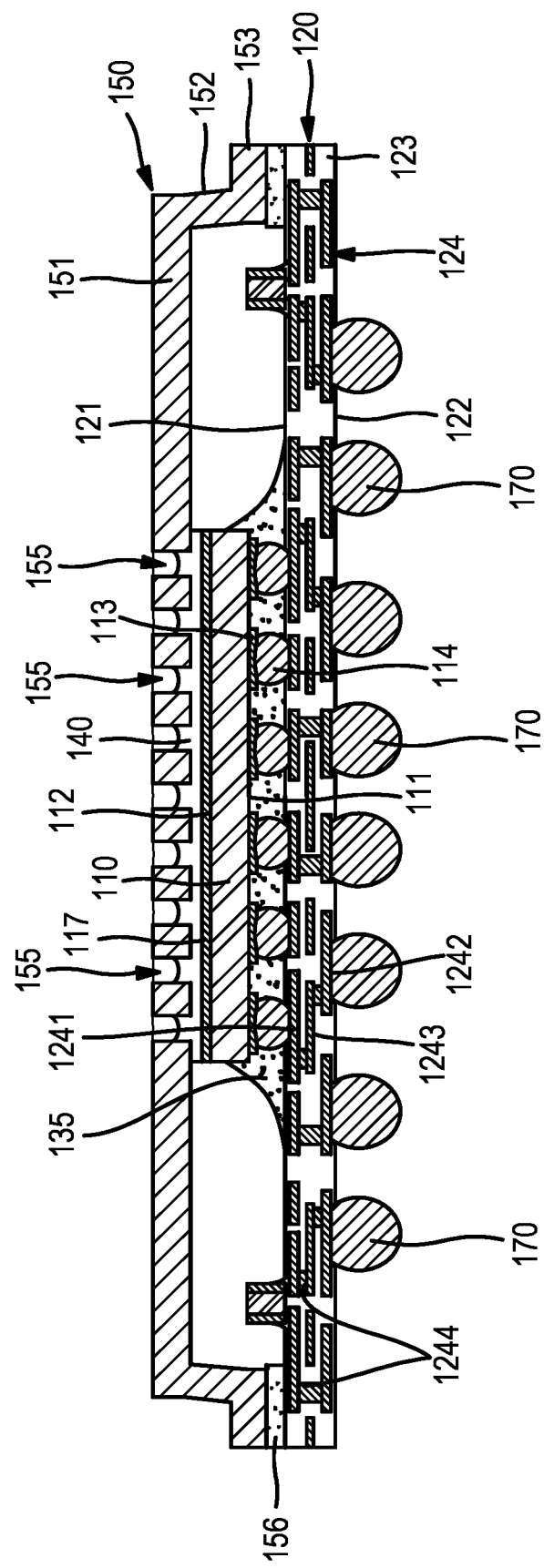

FIG. 2E shows a cross-sectional view of electronic device 100 at a later stage of manufacture. In the example shown in FIG. 2E, external terminals 170 can be provided. External terminals 170 can be coupled to outer terminals 1242 of substrate 120. In some examples, after external terminals 170 are located on outer terminals 1242 of substrate 120, a reflow process can be performed, or a laser beam can be irradiated and then cooled, thereby coupling external terminals 170 to outer terminals 1242. External terminals 170 can comprise or be referred to as solder balls, solder-coated metal (Cu)-core balls, pillars, bumps, or pins. In some examples, the thickness of each external terminal 170, as measured from its respective outer terminal 1242, can range from approximately 50 μm to approximately 1000 μm. External terminals 170 can couple electronic device 100 to an external device.

Figure 3:
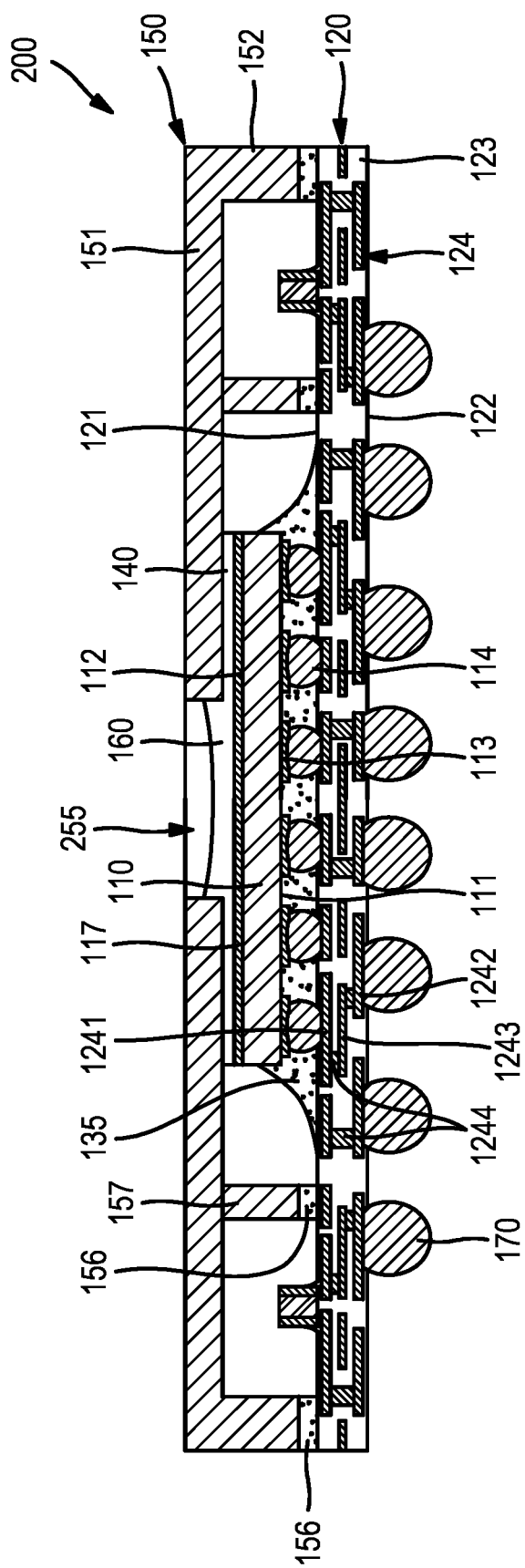
FIG. 3 shows a cross-sectional view of an example electronic device.

FIG. 3 shows a cross-sectional view of an example electronic device 200. Electronic device 200 can be similar to electronic device 100 shown in FIG. 1. In the example shown in FIG. 2, except lid 150 can comprise and define sink hole 255 and solder 160 can be deposited in sink hole 255. In some examples, TIM 140 can be located directly on electronic component 110, for example electronic device 200 can be devoid of metallization layer 117. In some examples, metallization layer 117 can be coupled to lid top 151, for example electronic device 200 can be devoid of TIM 140.

A portion of TIM 140 or metallization layer 117 can be located in sink hole 255. In some examples, solder 160 can be located in sink hole 255. In some examples, solder 160 can fill, or partially fill, openings or voids in TIM 140 or metalation layer 117. In some examples, solder 160 can flow into gaps between TIM 140 and lid top 151 or into gaps between metallization layer 117 and lid top 151. In some examples, lid 150 can comprise lid leg 157. In some examples, lid leg 157 extends between lid top 151 and substrate 120 and extends from lid 150 to couple with substrate inner side 121 between electronic component 110 and electronic component 1101. Lid leg 157 can be located between semiconductor component 110 and lid wall 152. In some examples, one or more electronic components 1101 can be located between lid leg 157 and lid wall 152. In some examples, lid leg 157 can surround semiconductor component 110. Lid wall 152 and lid leg 157 can be adhered to substrate 120 via adhesive 156.

Figure 4A:
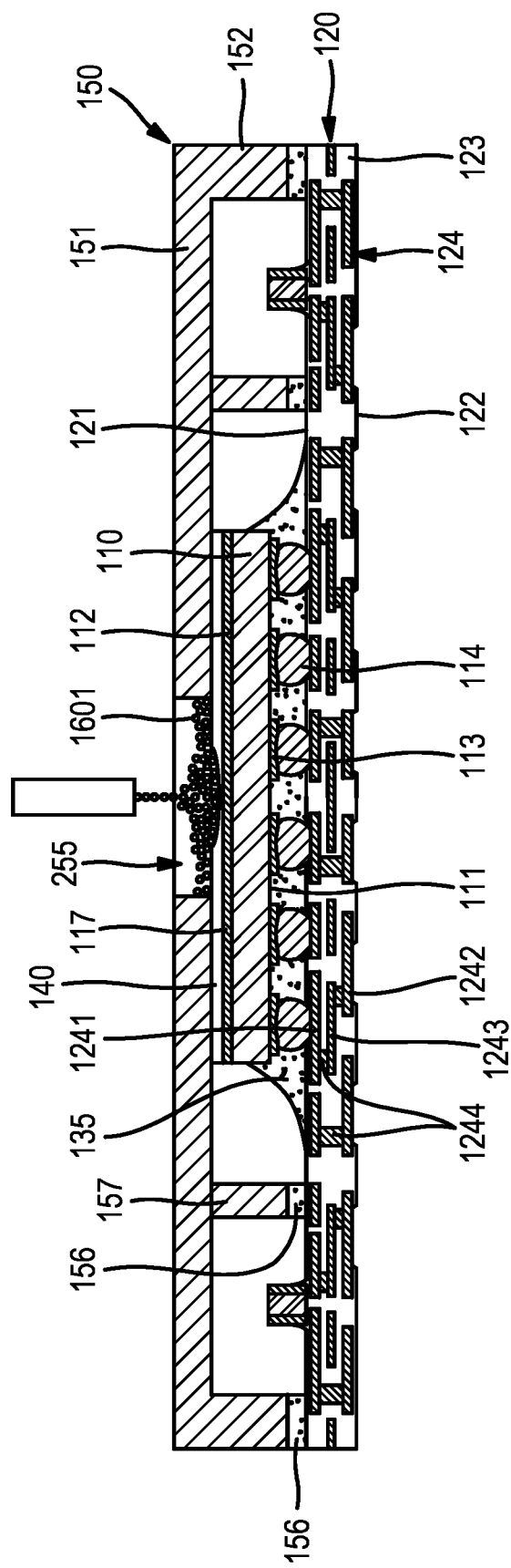
FIGS. 4A to 4B show cross-sectional views of an example method for manufacturing an example electronic device.
Figure 4B:
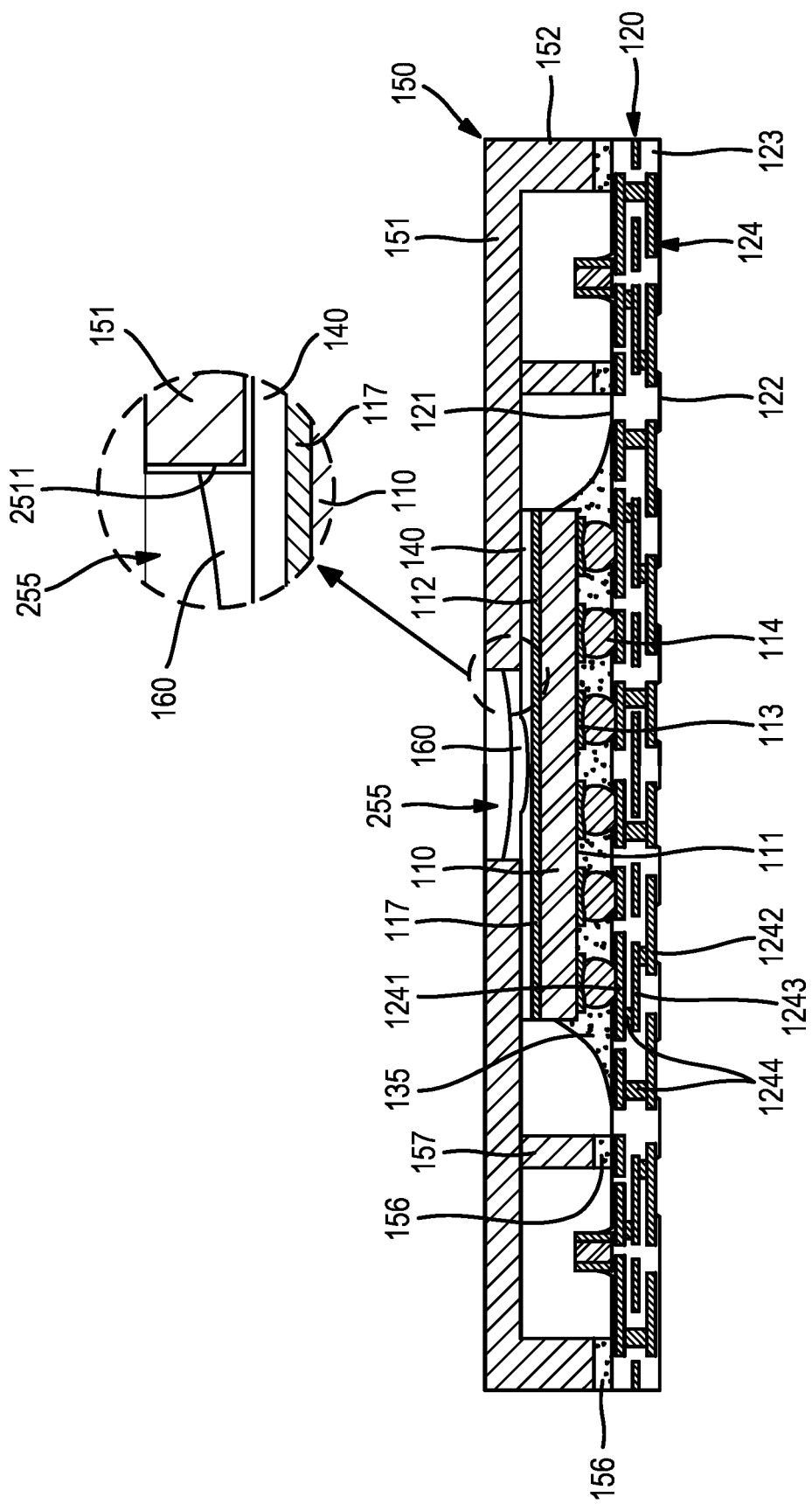

FIGS. 4A to 4B show cross-sectional views of an example method for manufacturing electronic device 200. FIG. 4A shows a cross-sectional view of electronic device 200 at a later stage of manufacture. In the example shown in FIG. 4A, lid 150 having sink hole 255 can be coupled to substrate 120 and electronic component 110. Lid 150 is positioned such that sink hole 255 is located over TIM 140 or metallization layer 117. In some examples, the area or footprint of sink hole 255 can be smaller than the area or footprint of TIM 140. In some examples, the area or footprint of sink hole 255 can be smaller than the area or footprint of metallization layer 117. In some examples, the area or footprint of sink hole 255 can be between approximately 10% to approximately 90% of the area or footprint of TIM 140. In some examples, the area or footprint of sink hole 255 can be between approximately 10% to approximately 90% of the area or footprint of metallization layer 117. When TIM 140 or metallization layer 117 is/are melted during a reflow process, a region of TIM 140 or metallization layer 117 can flow into the sink hole 255. In some examples, after the reflow process, a plurality of solder beads 1601, also referred to as solder drops or solder balls, can be dropped into sink hole 255. In some examples, a solder paste, which can be dispensed or printed into sink hole 255, can be employed in place of or in addition to solder beads 1601. Lid 150 including sink hole 255 tends to reduce occurrences of an electrical short of electronic component 110 due to flow-out of TIM 140, metallization layer 117, or solder 160. For example, the configuration of LID 150 tends to reduce a likelihood of TIM 140, metallization layer 117, or solder 160 extending to upper surface 121 of substrate 120.

FIG. 4B shows a cross-sectional view of electronic device 200 at a later stage of manufacture. In the example shown in FIG. 4B, after the reflow and cooling process, solder 160 can be integrated with TIM 140 or metallization layer 117. In some examples, if TIM 140 or metallization layer 117 includes air voids, melted solder 160 can fill the voids. In some examples, the lower surface 1512 of lid top 151 or the walls 2551 of sink hole 255 can be provided with wettability enhancement layer 2511 to enhance wettability of TIM 140, metallization layer 117, or solder 160. While solder 160 is described with reference to electronic device 200 and sink hole 255, it is contemplated and understood that in some examples, electronic device 100 can include solder 160. For example, solder beads 1601 as shown in FIG. 4A, or a solder paste, can be deposited in capillary holes 155 as shown in FIG. 1 over TIM 140 or metallization layer 117.

Figure 5:
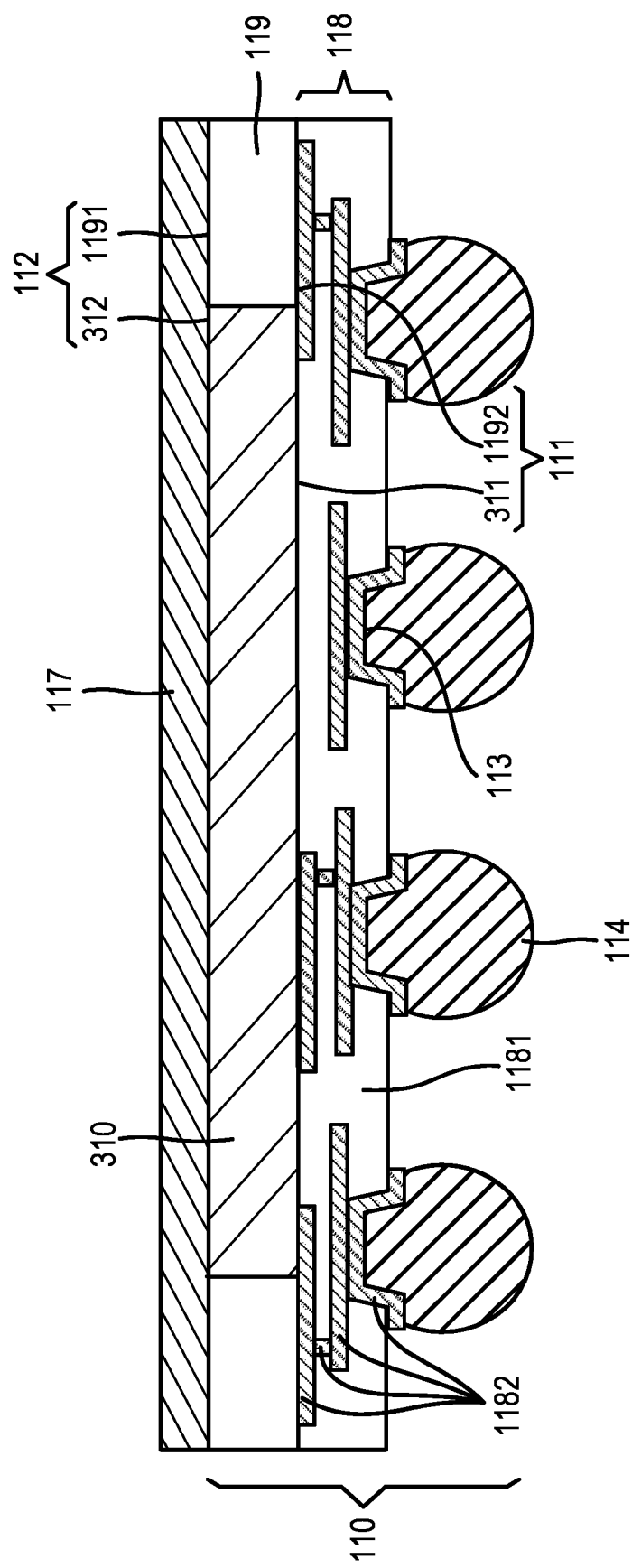
FIG. 5 shows a cross-sectional view of an example electronic component.

FIG. 5 shows a cross-sectional view of a portion of an example electronic component 110. In some examples, electronic component 110 can be a Wafer Level Fan-Out (WLFO) package, a Flip Chip Molded Ball Grid Array (FCmBG) package, or a Silicon Wafer Integrated Fan-Out Technology (SWIFT) package. Electronic component 110 can include a semiconductor die 310 having inner or active side 311 and backside 312. Semiconductor die 310 can comprise, for example a DSP, network processor, power management unit, audio processor, wireless baseband SoC processor, sensor, ASIC, memory, AoP, AiP, 5G NR mm-Wave module, sub-6 GHz RF module, IPD. In the example shown in FIG. 5, electronic component 110 comprises encapsulant 119 located around, for example surrounding, the lateral sides of semiconductor die 310. In various examples, electronic component 110 can comprise metallization layer 117 formed over backside 112 of electronic component 110. In some examples, metallization layer 117 contacts encapsulant 119. In some examples, backside 112 of electronic component 110 can include backside 312 of semiconductor die 310 and outer side 1191 of encapsulant 119. For example, metallization layer 117 can be formed over backside 312 of semiconductor die 310 and outer side 1191 of encapsulant 119. Outer side 1191 of encapsulant 119 can be coplanar with backside 312 of semiconductor die 310. In some examples, metallization layer 117 can comprise Ti, Cu, Ni, or SnAg. In some examples, metallization layer 117 can also comprise Ni, Cu, In, Au, or Ag.

In various examples, RDL (or substrate) 118 can be provided on inner side 111 of electronic component 110. Inner side 111 of electronic component 110 can include inner or active side 311 of semiconductor die 310 and inner side 1192 of encapsulant 119. For example, RDL 118 can be disposed over inner side 311 of semiconductor die 310 and inner side 1192 of encapsulant 119. RDL 118 comprises dielectric structure 1181 and conductive structure 1182. Conductive structure 1182 can comprise contact pads 113. Connectors 114 can be provided on contact pads 113.

A person skilled in the art will understand that the electronic component 110 shown in FIG. 5 is an example for understanding the present disclosure, and RDL 118 and encapsulant 119 optionally can be omitted. As an example, electronic component 110 can comprise only a semiconductor die or a semiconductor package including a semiconductor die.

Figure 6:
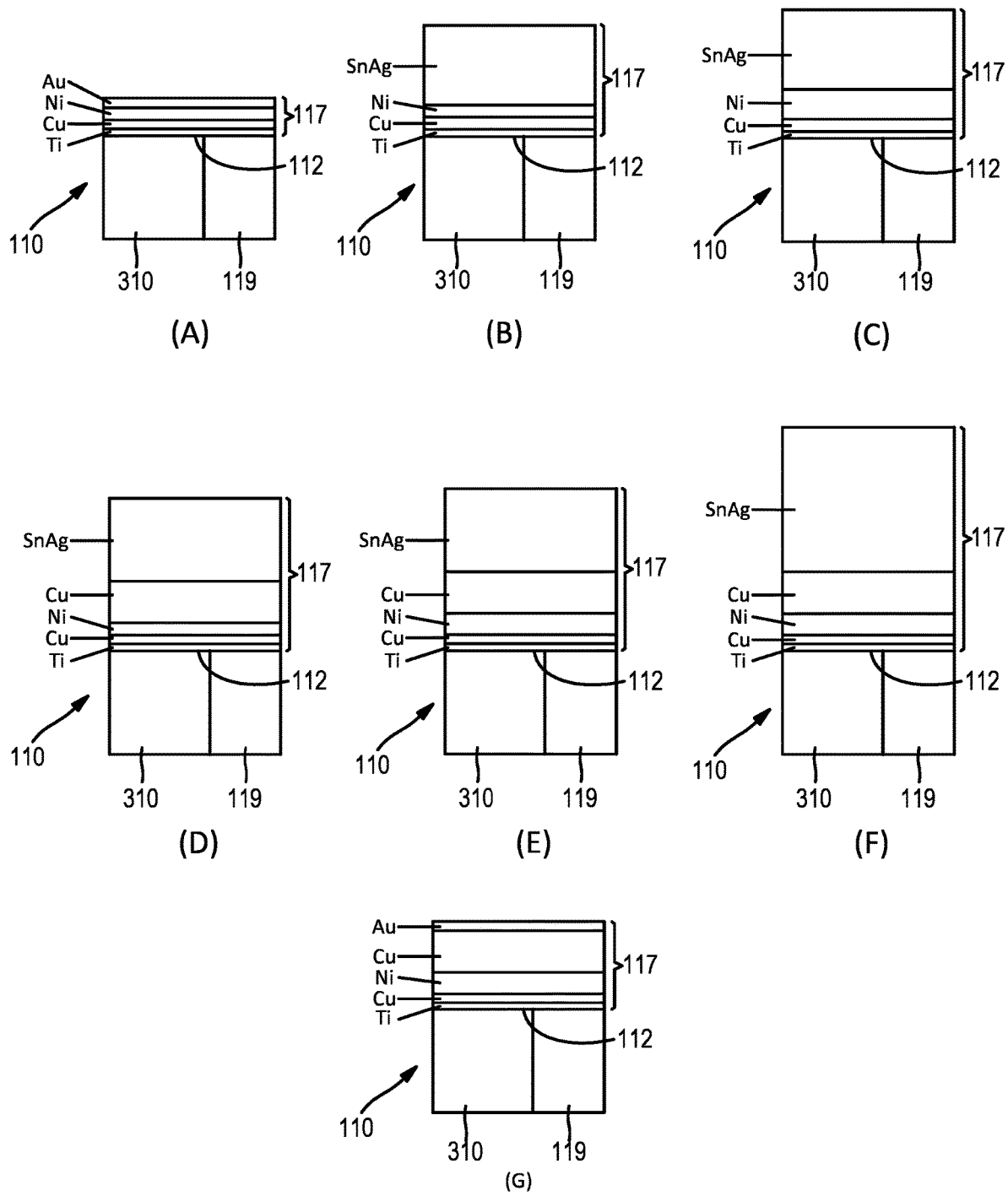
FIG. 6 shows cross-sectional views of example electronic components.

FIG. 6 shows additional details of example metallization layers 117 of electronic component 110. With reference to FIG. 6(A), in some examples, metallization layer 117 can be formed by sequentially providing a titanium (Ti) layer having a thickness between 0.1 μm and 0.2 μm, a copper (Cu) layer having a thickness between 0.1 μm and 0.2 μm, a nickel (Ni) layer having a thickness between 0.2 μm and 0.3 μm, and a gold (Au) layer having a thickness between 0.1 μm and 0.2 μm on backside 112 of electronic component 110. For example, the Ti layer is formed on backside 112, the Cu layer is formed on the Ti layer, the Ni layer is formed on the Cu layer, and the Au layer is formed on the Ni layer.

With reference to FIG. 6(B), in some examples, metallization layer 117 can be formed by sequentially providing a Ti layer having a thickness between 0.1 μm and 0.2 μm, a Cu layer having a thickness between 0.1 μm and 0.2 μm, a Ni layer having a thickness between 0.2 μm and 0.3 μm, and a tin-silver (SnAg) layer having a thickness between 10.0 μm and 20.0 μm on backside 112 of electronic component 110. For example, the Ti layer is formed on backside 112, the Cu layer is formed on the Ti layer, the Ni layer is formed on the Cu layer, and the SnAg layer is formed on the Ni layer.

With reference to FIG. 6(C), in some examples, metallization layer 117 can be formed by sequentially providing a Ti layer having a thickness between 0.1 μm and 0.2 μm, a Cu layer having a thickness between 0.1 μm and 0.2 μm, a Ni layer having a thickness between 2.0 μm and 3.0 μm, and a SnAg layer having a thickness between 10.0 μm and 20.0 μm on backside 112 of electronic component 110. For example, the Ti layer is formed on backside 112, the Cu layer is formed on the Ti layer, the Ni layer is formed on the Cu layer, and the SnAg layer is formed on the Ni layer.

With reference to FIG. 6(D), in some examples, metallization layer 117 can be formed by sequentially providing a Ti layer having a thickness between 0.1 μm and 0.2 μm, a first Cu layer having a thickness between 0.1 μm and 0.2 μm, a Ni layer having a thickness between 0.2 μm and 0.3 μm, a second Cu layer having a thickness between 3.0 μm and 4.0 μm, and a SnAg layer 10.0 μm and 20.0 μm on backside 112 of electronic component 110. For example, the Ti layer is formed on backside 112, the first Cu layer is formed on the Ti layer, the Ni layer is formed on the first Cu layer, the second Cu layer is formed on the Ni layer, and the SnAg layer is formed on the second Cu layer.

With reference to FIG. 6(E), in some examples, metallization layer 117 can be formed by sequentially providing a Ti layer having a thickness between 0.1 μm and 0.2 μm, a first Cu layer having a thickness between having a thickness between 0.1 μm and 0.2 μm, a Ni layer having a thickness between 2 μm-3 μm, a second Cu layer having a thickness between 3.0 μm and 4.0 μm, and a SnAg layer having a thickness between 10.0 μm and 20.0 μm on backside 112 of electronic component 110. For example, the Ti layer is formed on backside 112, the first Cu layer is formed on the Ti layer, the Ni layer is formed on the first Cu layer, the second Cu layer is formed on the Ni layer, and the SnAg layer is formed on the second Cu layer.

With reference to FIG. 6(F), in some examples, metallization layer 117 can be formed by sequentially providing a Ti layer having a thickness between 0.1 μm and 0.2 μm, a first Cu layer having a thickness between 0.1 μm-0.2 μm, a Ni layer having a thickness between 2.0 μm and 3.0 μm, a second Cu layer having a thickness between 3.0 μm and 4.0 μm, and a SnAg layer having a thickness between 30 μm and 40 μm on backside 112 of electronic component 110. For example, the Ti layer is formed on backside 112, the first Cu layer is formed on the Ti layer, the Ni layer is formed on the first Cu layer, the second Cu layer is formed on the Ni layer, and the SnAg layer is formed on the second Cu layer.

With reference to FIG. 6(G), in some examples, metallization layer 117 can be formed by sequentially providing a Ti layer having a thickness between 0.1 μm and 0.2 μm, a first Cu layer having a thickness between 0.1 μm and 0.2 μm, a Ni layer having a thickness between 2.0 μm and 3.0 μm, a second Cu layer having a thickness between 3.0 μm and 4.0 μm, and an Au layer having a thickness between 0.1 μm and 0.2 μm on backside 112 of electronic component 110. For example, the Ti layer is formed on backside 112, the first Cu layer is formed on the Ti layer, the Ni layer is formed on the first Cu layer, the second Cu layer is formed on the Ni layer, and the Au layer is formed on the second Cu layer. While FIGS. 6(A) to 6(G) show metallization layer 117 formed over encapsulant 119, it is contemplated and understood that encapsulant 119 can be omitted from electronic component 110 or metallization layer 117 can be formed over semiconductor die 310 prior to encapsulation, such that metallization layer 117 ends at the edge/lateral side of semiconductor die 310.

Figure 7A:
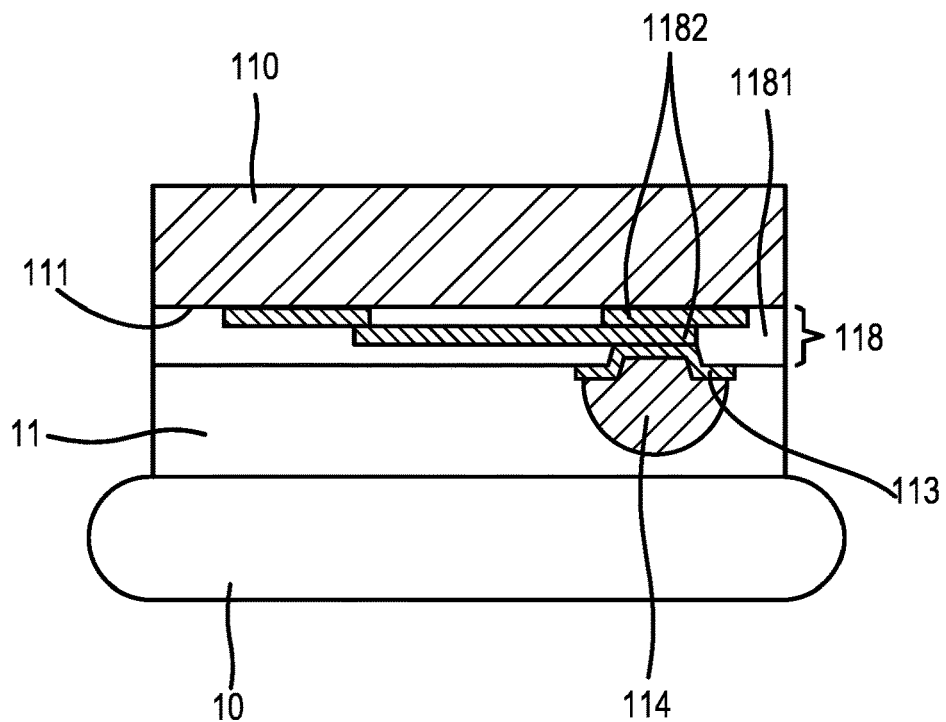
FIGS. 7A to 7F show cross-sectional views of an example method for manufacturing an example electronic component.

FIGS. 7A to 7F show cross-sectional views of an example method for manufacturing an example electronic component 110. FIG. 7A shows a cross-sectional view of electronic component 110 at an early stage of manufacture. In some examples, electronic component 110 can include RDL 118 over inner or active surface 111.

In the example shown in FIG. 7A, carrier 10 can be provided. In some examples, temporary adhesive 11 can be provided over an upper side of carrier 10. Electronic component 11 can be coupled to carrier 10 via temporary adhesive 11. For example, RDL 118 and connectors 114 can be coupled to temporary adhesive 11. The temporary adhesive 11 can comprise or be referred to as a temporary adhesive film, a temporary adhesive tape, or a temporary adhesive coating. For example, the temporary adhesive 11 can be a heat release tape or film or a light release tape or film, where the adhesive strength is weakened or removed by heat or light, respectively. In some examples, the adhesive strength of the temporary adhesive 11 can be weakened or removed by physical force or by chemical reaction. Although one electronic component 110 is shown in FIG. 7A, in some examples, a plurality of electronic components 110 can be provided in the form of, for example, a circular wafer or a rectangular panel in which rows and columns of electronic components 110 are arranged or rearranged.

Figure 7B:
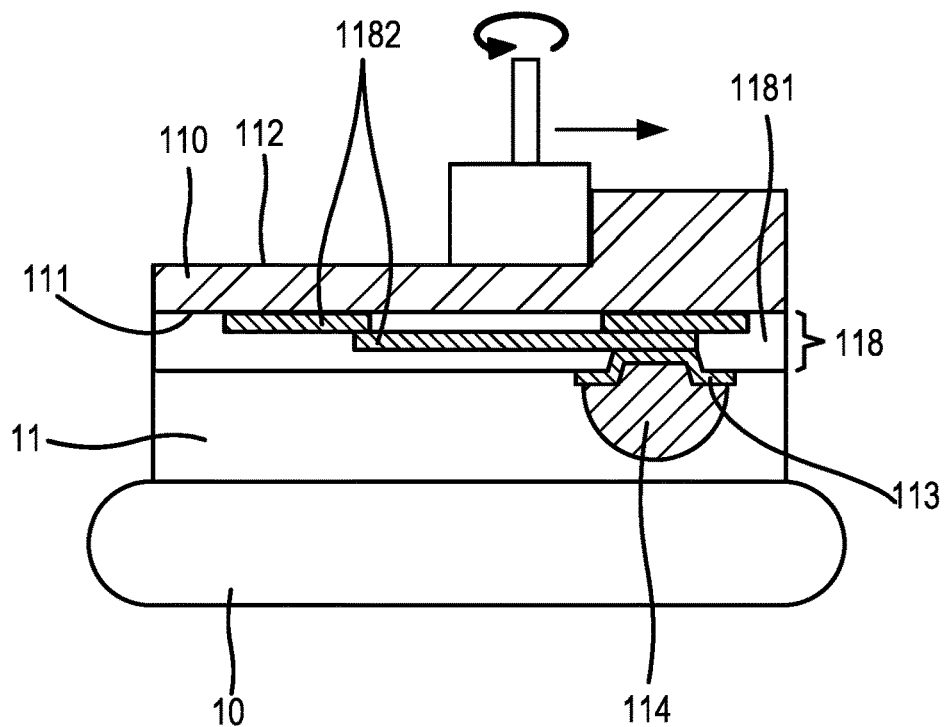

FIG. 7B shows a cross-sectional view of electronic component 110 at a later stage of manufacture. In the example shown in FIG. 7B, a back-grinding process can be performed to thin electronic component 110, for example to remove a portion of the backside of electronic component 110. In some examples, the grinding process can be performed until the thickness of electronic component 110, as measured between inner or active side 111 and backside 112, is between approximately 40 μm and approximately 1000 μm.

Figure 7C:
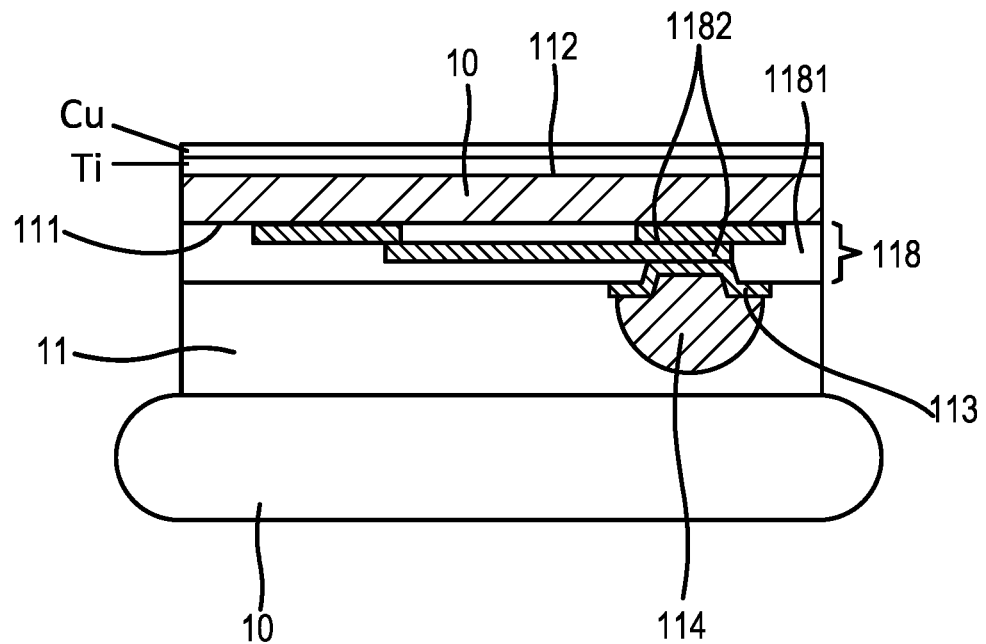

FIG. 7C shows a cross-sectional view of electronic component 110 at a later stage of manufacture. In the example shown in FIG. 7C, a metal deposition process can be performed. In some examples, a titanium (Ti) layer, a tungsten (W) layer, or a tantalum (Ta) layer can be deposited as a barrier metal or a seed metal (seed layer) on backside 112 of electronic component 110. A copper (Cu) layer can be deposited on the Ti layer. In some examples, the Ti layer and the Cu layer can be provided by Chemical Vapor Deposition (CVD), Low Pressure Chemical Vapor Deposition (LPCVD), Plasma Enhanced Chemical Vapor Deposition (PECVD), Physical Vapor Deposition (PVD), evaporation, sputtering, or Atomic Layer Deposition (ALD). In some examples, the Ti layer can be provided to have a thickness in a range of approximately 0.1 μm to approximately 0.2 μm. In some examples, the Cu layer can be provided to have a thickness in a range of approximately 0.1 μm to approximately 0.2 μm.

Figure 7D:
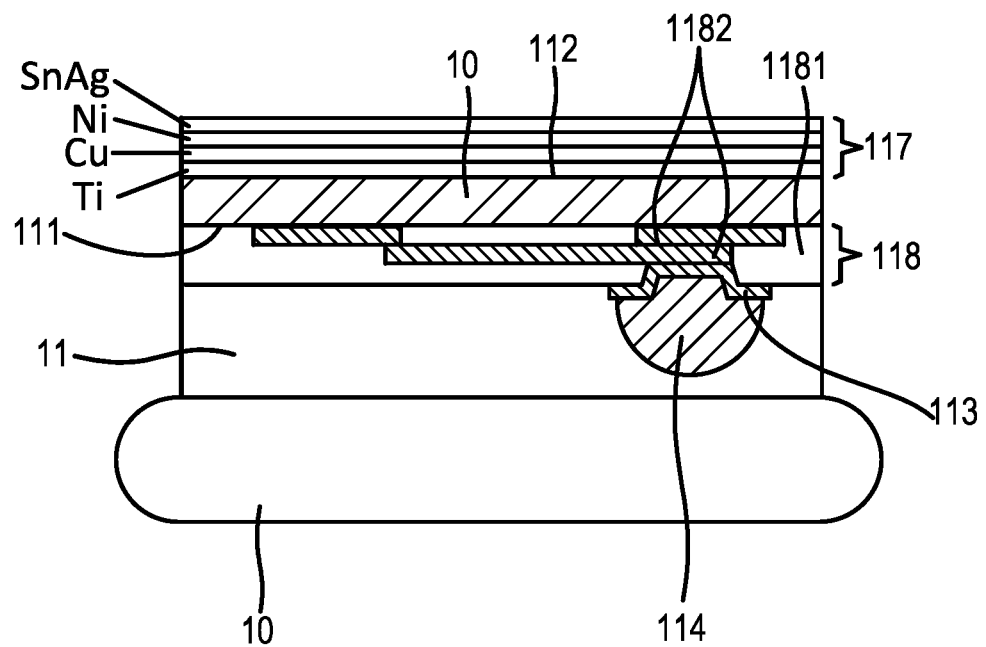

FIG. 7D shows a cross-sectional view of electronic component 110 at a later stage of manufacture. In the example shown in FIG. 7D, a plating process can be performed. In some examples, a Ni layer is plated on the Cu layer as a barrier metal or a seed metal. A tin-silver (SnAg) layer can be plated on the nickel (Ni) layer. In some examples, Ni layer and SnAg layer can each be formed by electroplating. For example, the Cu layer can be coupled to a negative electrode, and a Ni rod can be coupled to a positive electrode, followed by putting same into an electrolyte and applying a direct current power, thereby electroplating the Ni layer on the Cu layer. After forming the Ni layer, the Ni layer can be coupled to a negative electrode, and a SnAg rod can be coupled to a positive electrode, followed by putting the same into an electrolyte, for example an electrolyte containing SnAg, and applying a direct current power to electroplate the SnAg layer on the Ni layer. In some examples, the Ni layer can be provided to have a thickness in a range of approximately 0.2 μm to approximately 3 μm. In some examples, the SnAg layer can be provided to have a thickness in a range of 10 μm to approximately 40 μm. In this way, the Ti layer, the Cu layer, the Ni layer, and the SnAg layer can be sequentially provided on backside 112 of electronic component 110.

Figure 7E:
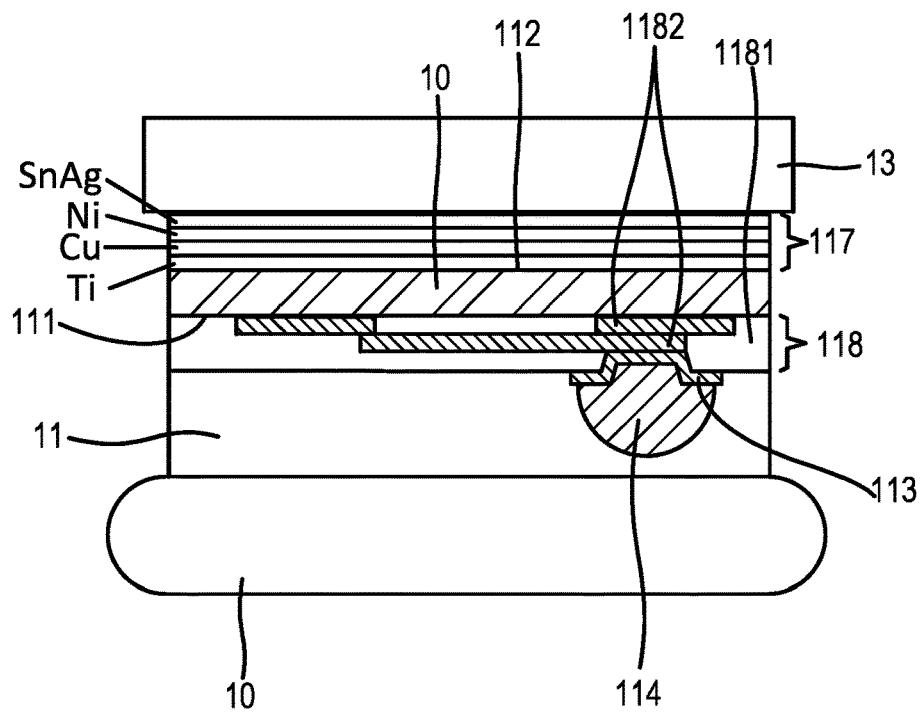
Figure 7F:
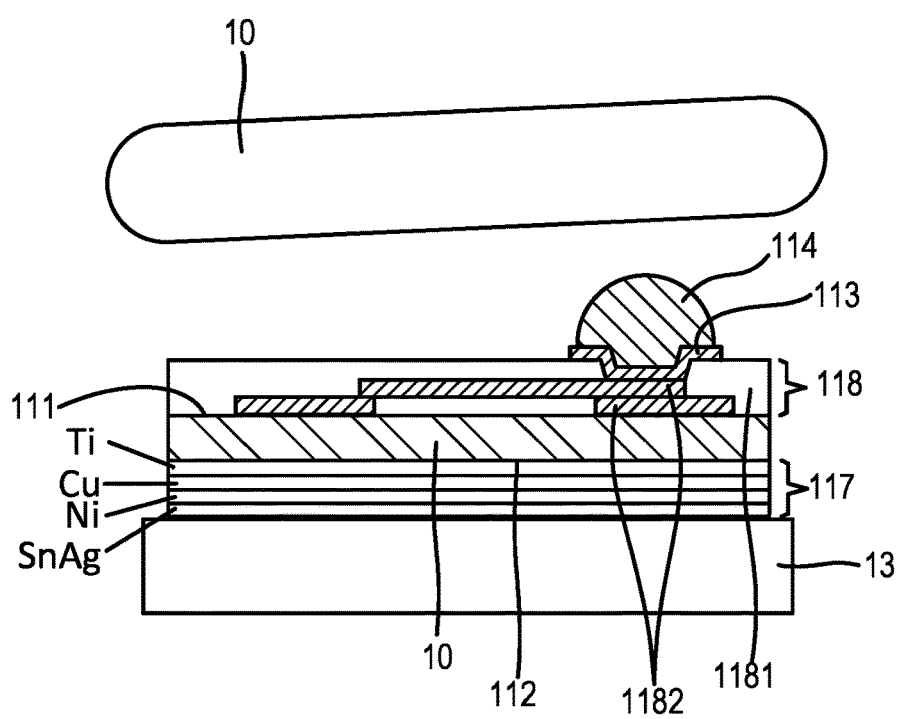

FIGS. 7E and 7F shows a cross-sectional view of electronic component 110 at a later stage of manufacture. In the example shown in FIG. 7E, carrier 13 can be provided. In some examples, carrier 13 can be a tape or adhesive file. Metallization layer 117 can be coupled, for example adhesively attached to carrier 13. In the example shown in FIG. 7F, debonding of electronic component 110 from carrier 10 and singulation of electronic component 110 can be performed. In some examples, electronic component 110 can be released or uncoupled from carrier 10 by exposing temporary adhesive 11 to heat or light thereby removing the adhesive strength of temporary adhesive 11 and separating carrier 10 from electronic component 110, for example from RDL layer 118 or connectors 114. In some examples, electronic components 110 can be in the form of a circular wafer or a square panel and the individual electronic components 110 can be separated from one another, for example by sawing or using a laser, during the singulation process. Carrier 13 can support and the individual electronic components 110 during singulation.

It will be appreciated by those by in the art that any of the backside metallization layers 117 shown in FIGS. 6(A) to 6(G) can be provided on semiconductor component 110 using a process similar to the process described in FIGS. 7A to 7F. In accordance with various examples, metallization layers 117, as disclosed herein, can enhance the bonding strength between metallization layer 117 and TIM 140 as shown in FIG. 1 and reduce void propagation in TIM 140. For example, in high-temperature environments, for example 150° C. or greater, electronic component 110 with metallization layer 117 can minimize, or eliminate, the void propagation phenomenon in TIM 140, to enhance or increase the thermal stability of the electronic device 100 of FIG. 1. For example, testing has demonstrated that metallization layers 117 comprising a SnAg layer, the void propagation rate of TIM 140, defined as the percentage of the total volume TIM 140 that is devoid of material, can be approximately 0.5% to approximately 2%. In some examples, metallization layer 117 can allow for TIM 140 to be eliminated. For example, metallization layers 117 comprising a SnAg layer can be directly coupled to LID 150 of FIG. 1.

Figure 8:
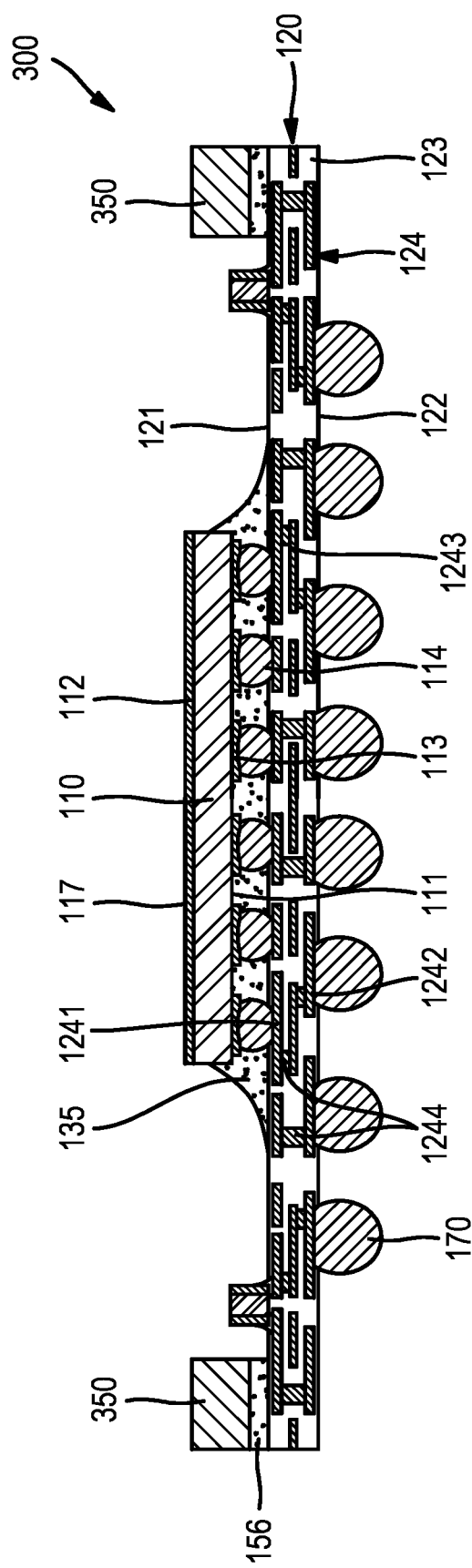
FIG. 8 shows a cross-sectional view of an example electronic device.

FIG. 8 shows a cross-sectional view of an example electronic device 300. In the example shown in FIG. 8, electronic device 300 can be similar to electronic device 100 shown in FIG. 1. In some examples, except stiffener 350, instead of lid 150, is included. In some examples, electronic device 300 includes stiffener 350. Stiffener 350 can be located on the periphery of substrate 120 and can be attached to or coupled with substrate 120 via adhesive 156. In some examples, the material, thickness, or width of stiffener 350 can be determined according to the size or warpage level of electronic device 300. The material of stiffener 350 can comprise metal, resin, or ceramic. In some examples, the material of stiffener 350 can be similar to that of lid 150 of FIG. 1. In some examples, the thickness of stiffener 350 can be similar to the thickness of electronic component 110. In some examples, a metallization layer 117, as described above, can be provided on electronic component 110.

In some examples, metallization layer 117 can be exposed to air, for example TIM 140 of FIG. 1 can be removed or not present in electronic device 300. In some examples, metallization layer 117 can be coupled to a cooling device, for example a lid or a heat sink. In some examples, metallization layer 117 can allow for elimination of a separate TIM 140. In some examples, metallization layer 117 can be formed over electronic device 110 at the wafer level, for example, as described above with reference to FIGS. 7A to 7F. In this regard, electronic component 110 can be coupled to substrate 120 with metallization layer 117 already formed on electronic component 110. Metallization layer 117 can facilitate or enhance heat dissipation, while reducing the overall thickness of electronic device 300, and can provide a smaller heat sink. In some examples, TIM 140 can be located on metallization layer 117. Metallization layer 117 can facilitate heat dissipation from electronic component 110 to TIM 140.

Figure 9A:
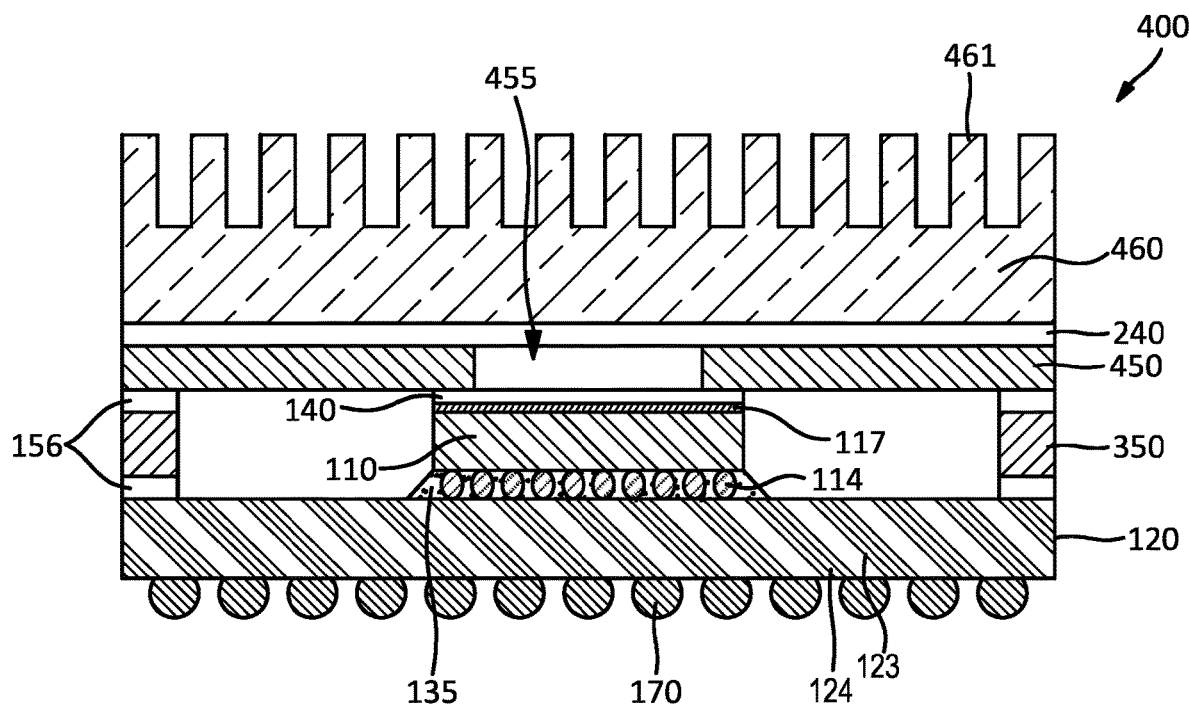
FIGS. 9A and 9B show a cross-sectional view and top view of an example electronic device.
Figure 9B:
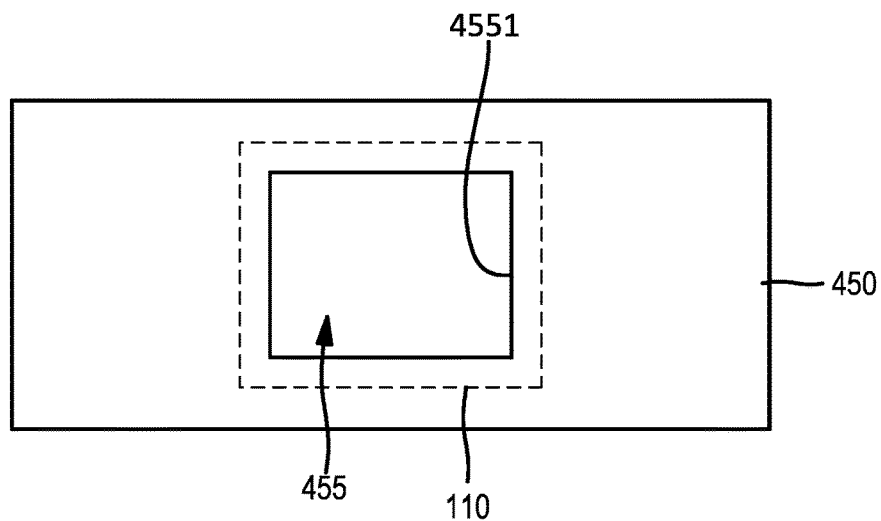

FIGS. 9A and 9B show a cross-sectional view and top-down view, respectively, of an example electronic device 400. Electronic device 400 shown in FIGS. 9A and 9B can be similar to electronic device 300 shown in FIG. 8. Electronic device 400 can include lid 450, TIM 140, TIM 240, and heat sink 460. Lid 450 can comprise and define a sink hole 455. In FIGS. 9A to 13B, substrate 120 is illustrated in a simplified manner; however, it is contemplated and understood that substrate 120 in FIGS. 9A to 13B includes the features and functionalities as previously described herein. In FIG. 9B, heat sink 460 and TIM 240 are removed.

Lid 450 having sink hole 455 and wall 4551 can be coupled to electronic component 110 via TIM 140. In some examples, TIM 140 can be located over metallization layer 117. In some examples, TIM 1140 can be removed and metallization layer 117 can extend to and contact LID 450. Lid 450 can be coupled to stiffener 350 via adhesive 156. In some examples, the footprint of electronic component 110 can be larger than the footprint of sink hole 455. In some examples, heat sink 460 can be coupled onto lid 450 via TIM 240. In some examples, heat sink 460 can comprise a plurality of heat dissipation fins 461. In some examples, sink hole 455 is generally devoid of material, for example there can be an open volume over electronic component 110. In some examples, electronic component 110 can include a baseband system on chip (SoC) processor. In some examples as described above with reference to FIGS. 3 to 4B, solder 160 can be located in sink hole 455 and coupled to TIM 140 or metallization layer 117. In some examples, the solder 160 can couple TIM 140 and TIM 240 which can enhance heat dissipation.

FIGS. 10A to 10D show cross-sectional views of an example method for manufacturing an example electronic device 400. In the example shown in FIG. 10A, electronic component 110 and one or more electronic components 1102 can be attached to substrate 120. Interface material 135 can be provided between electronic component 110 and substrate 120. Stiffener 350 can be attached to substrate 120 by adhesive 156. In some examples, electronic component 110 can include metallization layer 117.

Figure 10A:
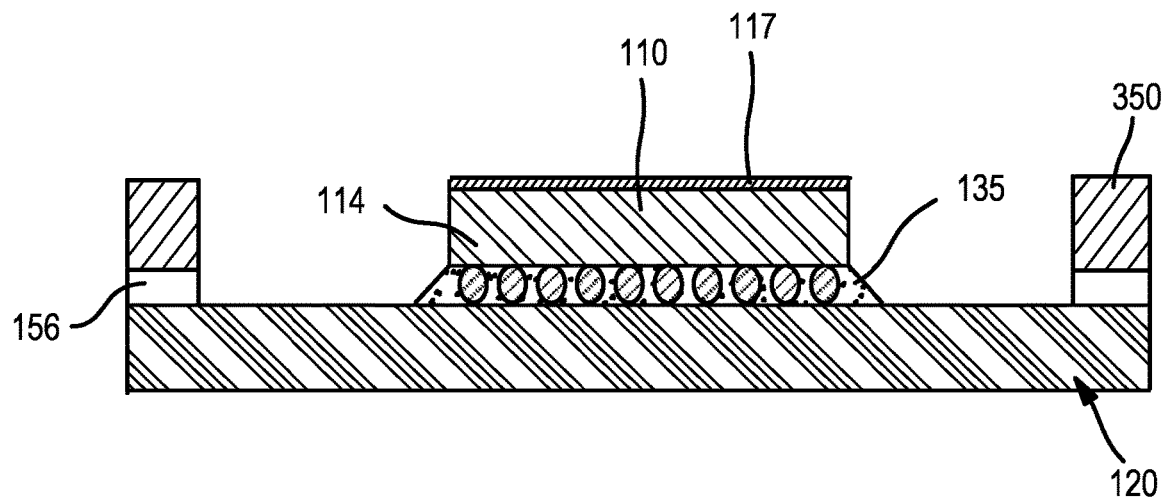
FIGS. 10A to 10D show cross-sectional views of an example method for manufacturing an example electronic device.
Figure 10B:
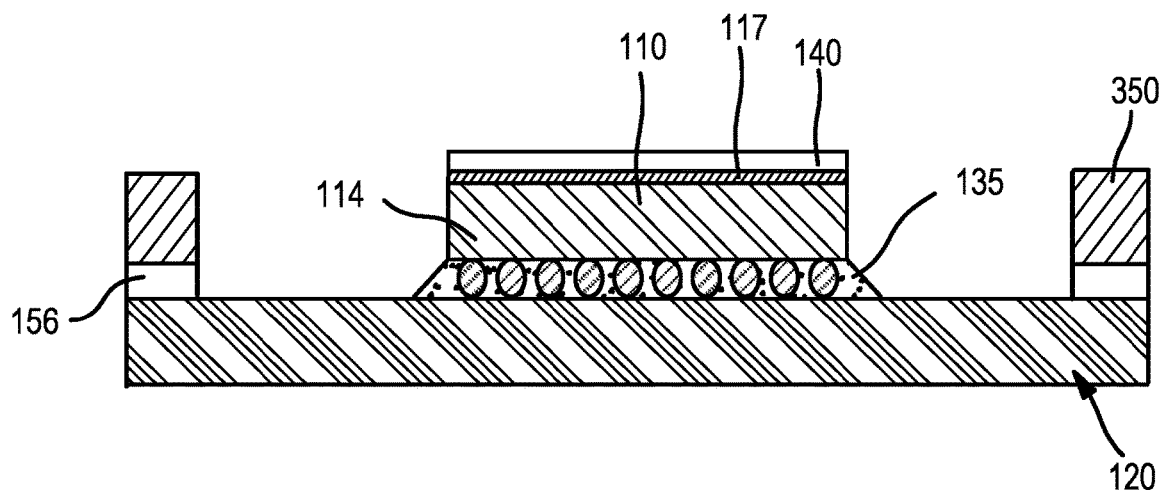

In the example shown in FIG. 10B, TIM 140 can be provided over electronic component 110. In some examples, TIM 140 can be provided on metallization layer 117. In some examples, TIM 140 can be located directly on backside 112, metallization layer 117 can be eliminated or not present.

Figure 10C:
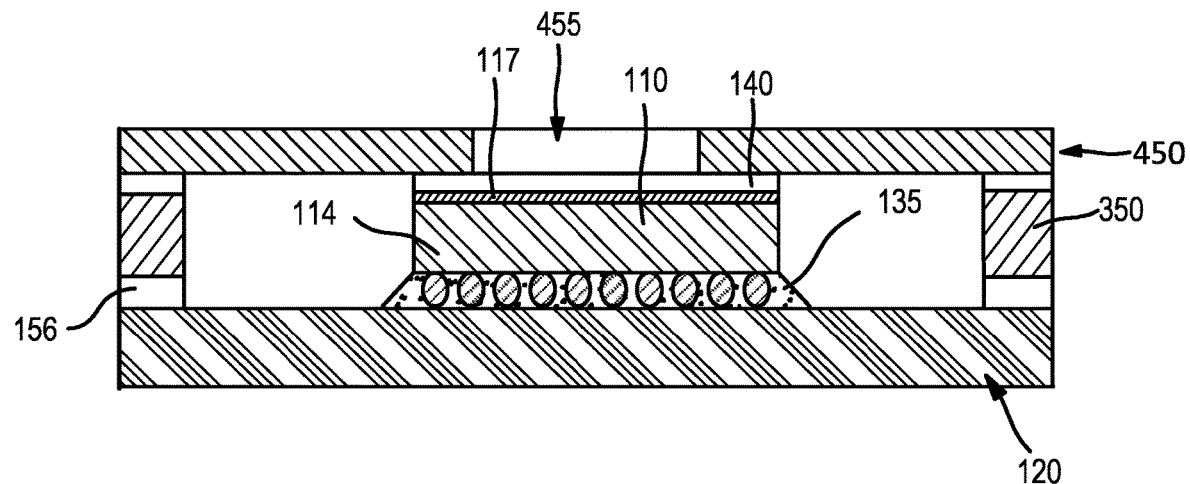
Figure 10D:
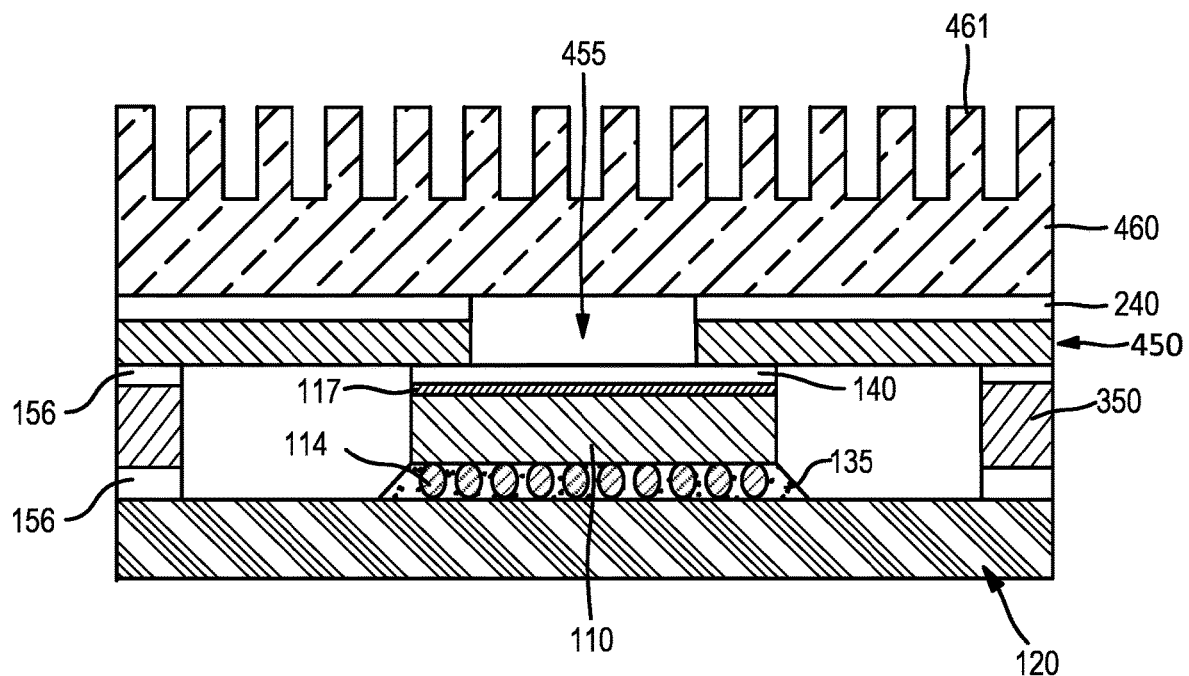

As shown in FIG. 10C, lid 450 having sink hole 455 can be located over and coupled to TIM 140. In some examples, LID 450 can be coupled directly to metallization layer 117, for example TIM 140 can be eliminated or not present. Lid 450 can be coupled to stiffener 350 via adhesive 156. In the example shown in FIG. 10D, heat sink 460 can be coupled to lid 450 via TIM 240. In this way, electronic component 110 can be thermally coupled to heat sink 460. In some examples, there is no TIM 140 in sink hole 455.

Figure 11A:
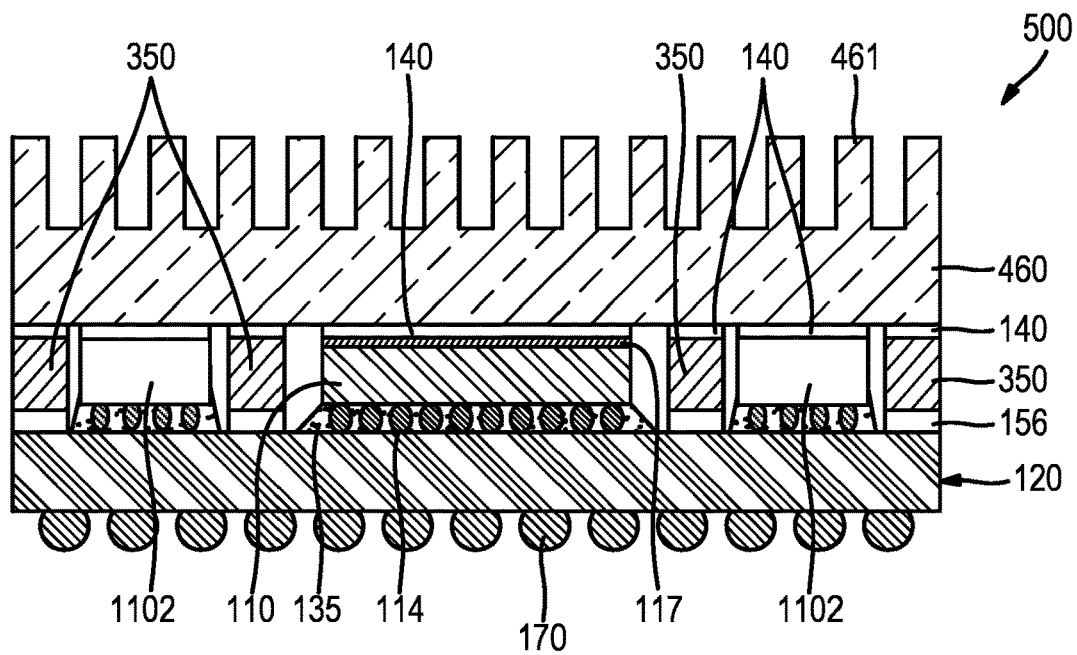
FIGS. 11A and 11B show a cross-sectional view and top view of an example electronic device.
Figure 11B:
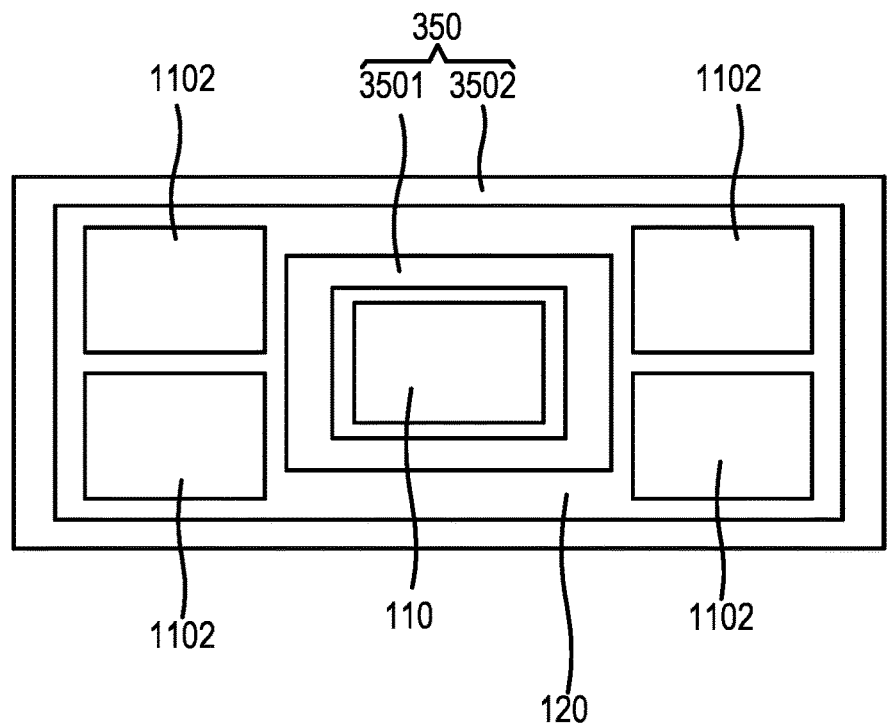

FIGS. 11A and 11B show a cross-sectional view and top-down view, respectively, of an example electronic device 500. In FIG. 11B heat sink 460 is removed to better illustrate the other components of electronic device 500. In the example shown in FIG. 11A, heat sink 460 can be coupled to electronic component 110 and stiffener 350 via TIM 140. In some examples, heat sink 460 can be coupled to electronic component 110 via metallization layer 117, for example TIM 140 can be eliminated from or not present over electronic component 110. As shown in FIG. 11B, stiffener 350 can comprise inner stiffener 3501 in the form of a substantially square or rectangular ring located around electronic component 110, and outer stiffener 3502 in the form of a substantially square or rectangular ring outside of electronic components 1102. Outer stiffener 3502 can be located at an outer periphery of substrate 120, and inner stiffener 3501 can be located at an inner periphery of substrate 110 between electronic component 110 and outer stiffener 3502. For example, inner stiffener 3501 can be located between electronic component 110 and electronic components 1102, and electronic components 1102 can be located between inner stiffener 3501 and outer stiffener 3502. Electronic components 1102 can comprise or be referred to as a semiconductor die, a semiconductor chip, a semiconductor package, a semiconductor device, an active component, or a passive component. Electronic components 1102 can comprise a DSP, network processor, power management unit, audio processor, wireless baseband SoC processor, sensor, ASIC, memory, AoP, AiP, 5G NR mm-Wave module, sub-6 GHz RF module, or integrated passive device IPD. In some examples, electronic components 1102 can comprise a dynamic random-access memory (DRAM) device.

Stiffener 350 can reduce or prevent warpage phenomenon even without the use of lid 450 of FIG. 9A and can reduce an overall thickness or height of electronic device 500. Eliminating lid 450 and thermally coupling electronic component 110 to heat sink 460 via TIM 140 or metallization layer 117 can also enhance thermal performance.

Figure 12A:
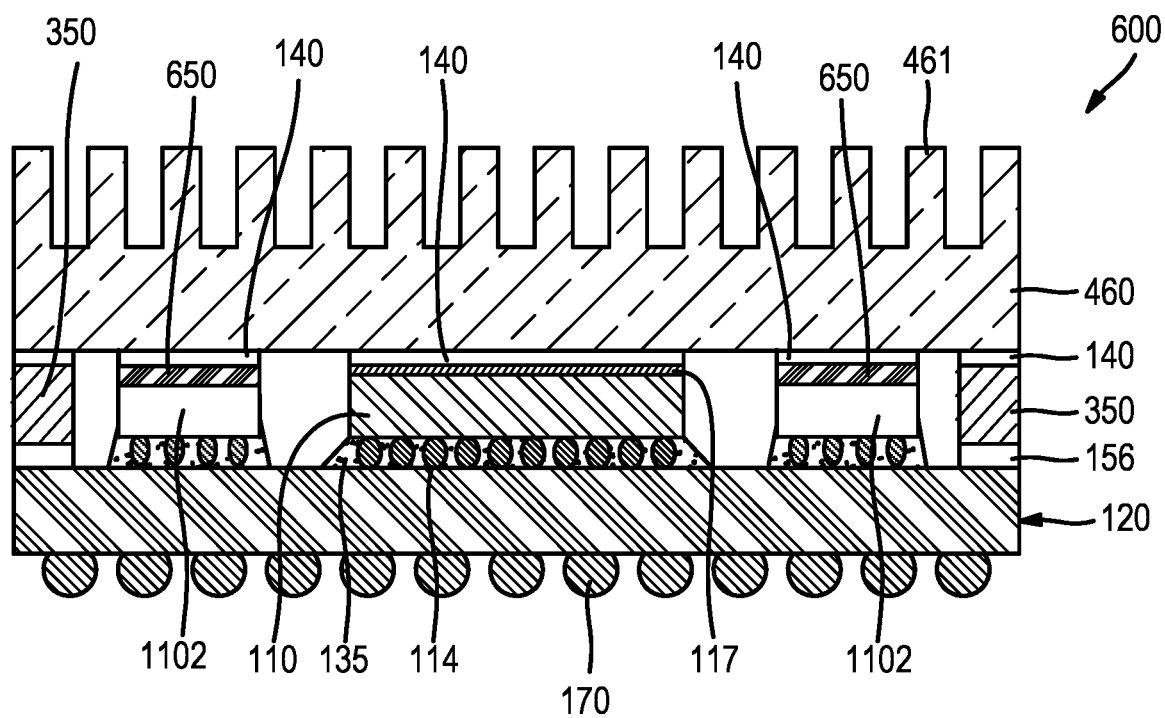
FIGS. 12A and 12B show a cross-sectional view and top view, respectively, of an example electronic device.
Figure 12B:
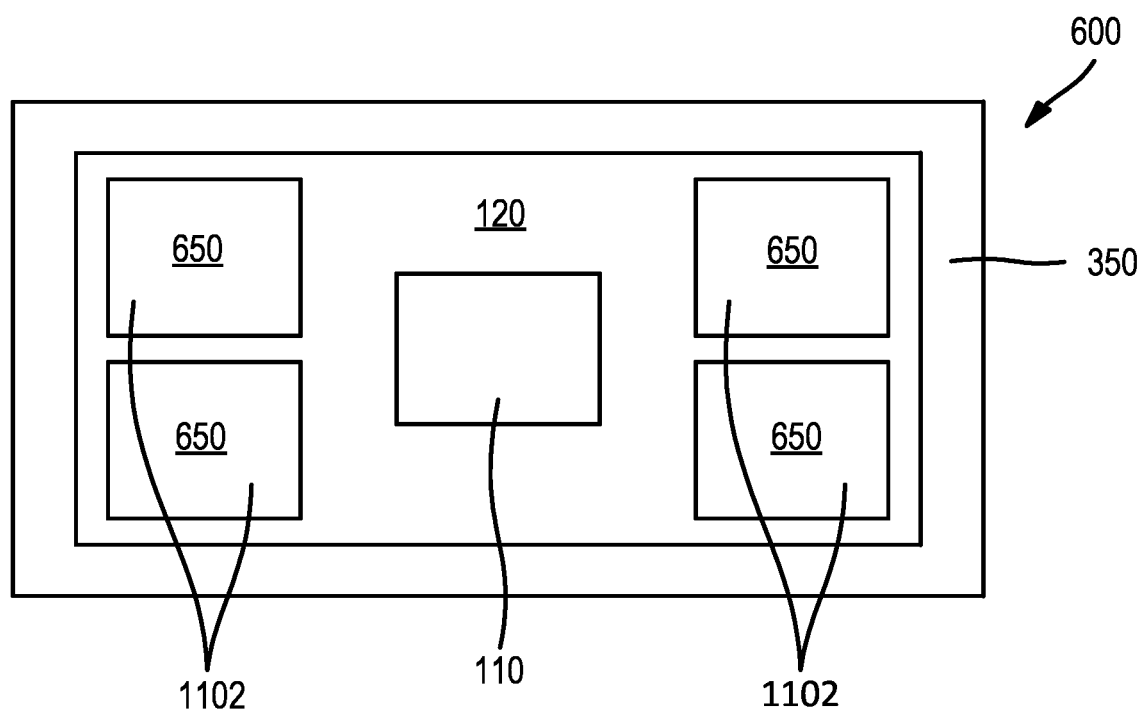

FIGS. 12A and 12B show a cross-sectional view and top-down view, respectively, of an example electronic device 600. In FIG. 12B, heat sink 460 is removed to better illustrate the other components of electronic device 600. Electronic device 600 can be similar to electronic device 500. In some examples, a lid 650 is located on each electronic component 1102. In various examples, electronic component 110 can be coupled to heat sink 460 via TIM 140, and electronic components 1102 can be coupled to heat sink 460 via lid 650 and TIM 140, for example where there is no lid over electronic component 110. In some examples, a component TIM similar to TIM 140 can be located between each lid 650 and its respective electronic component 1102. In some examples, a metallization layer similar to metallization layer 117, can be disposed between lids 650 and electronic components 1102. In some examples, metallization layer 117 can extend between electronic component 110 and heat sink 460, for example TIM 140 can be eliminated from or not present over electronic component 110. Lids 650 tend to reduce warpage. Coupling electronic component 110 to heat sink 140 via TIM 140 or metallization layer 117 with no lid over electronic component 110 tends to enhance thermal performance.

Figure 13A:
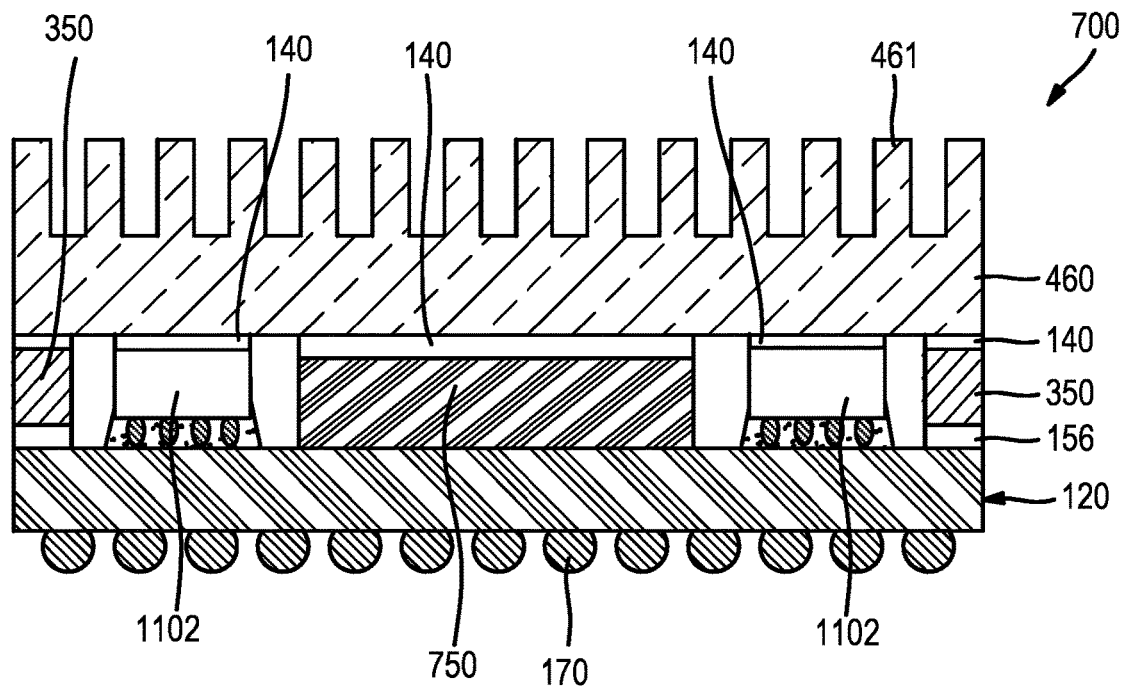
FIGS. 13A and 13B show a cross-sectional view and top view of an example electronic device.
Figure 13B:
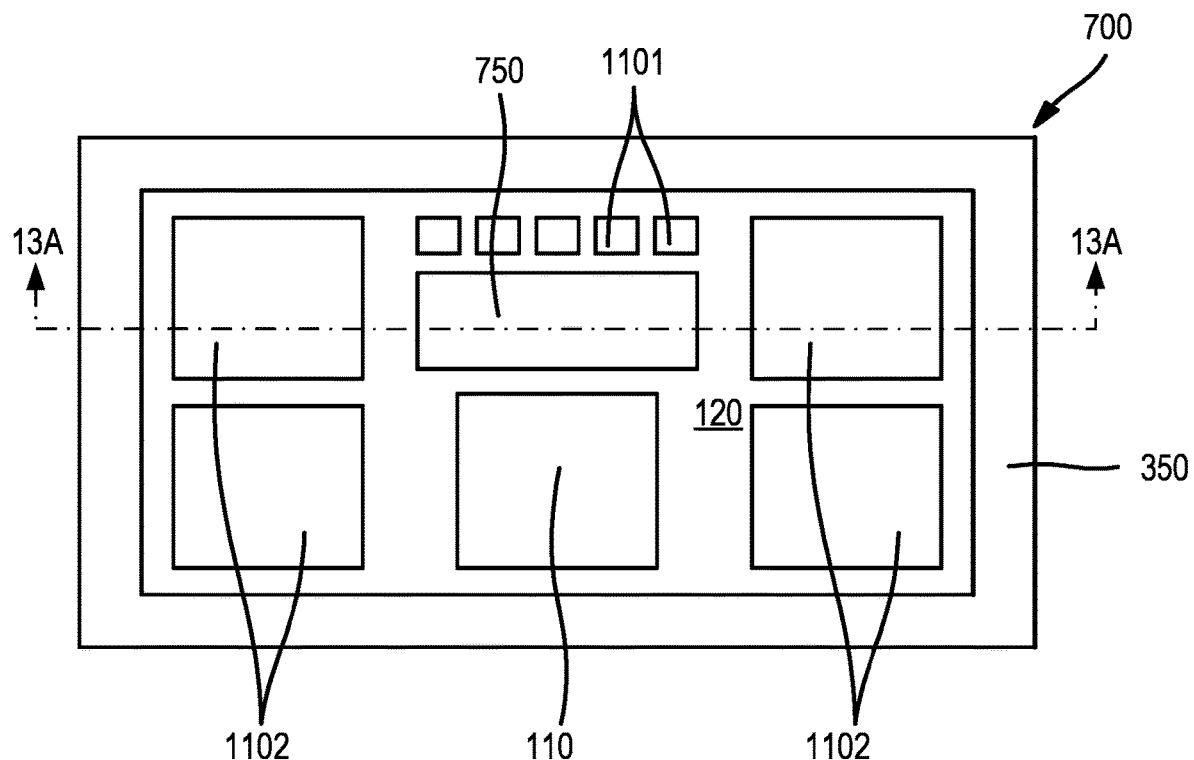

FIGS. 13A and 13B show a cross-sectional view and top-down view, respectively, of an example electronic device 700. In FIG. 13B, heat sink 460 is removed to better illustrate the other components of electronic device 600. The cross-sectional view of FIG. 13A is taken along the line 13A-13A in FIG. 13B. Electronic device 700 can be similar to electronic device 600 shown in FIG. 10A. In various examples, electronic device 700 can include lid 750 extending between substrate 120 and heat sink 460. In various embodiments, lid 750 can be coupled to heat sink 460 via TIM 140. In various examples, lid 750 can be coupled to substrate 120. In some examples, lid 750 can be coupled substrate 120 via a lid adhesive. In some examples, the lid adessive is conductive. In some examples, the lid adhesive is non-conductive. In various examples, electronic device 700 can include one or more electronic components 1101. In some examples, one or more electronic components 1101 can comprise a passive device, for example a capacitor, resistor, multi-layer ceramic capacitor, and so on. Lid 750 can be located between semiconductor device 110 and one or more electronic components 1101. Lid 750 can provide heat dissipation between substrate 120 and heat sink 460 via lid 750, while also reducing warpage.

The present disclosure includes reference to certain examples. It will be understood by those skilled in the art, however, that various changes can be made, and equivalents can be substituted without departing from the scope of the disclosure. In addition, modifications can be made to the disclosed examples without departing from the scope of the present disclosure. Therefore, it is intended that the present disclosure is not limited to the examples disclosed, but that the disclosure will include all examples falling within the scope of the appended claims.

The invention claimed is:

1. An electronic device, comprising:
a substrate comprising a conductive structure and an inner side and an outer side;
a first electronic component over the inner side of the substrate and coupled with the conductive structure;
a lid over the substrate and the first electronic component and comprising a first hole in the lid;
a wettability enhancing layer on sidewalls of the first hole; and
a thermal interface material between the first electronic component and the lid;
wherein the thermal interface material is in the first hole.

2. The electronic device of claim 1, wherein the lid comprises a plurality of holes, the plurality of holes including the first hole.

3. The electronic device of claim 1, wherein:
the first electronic component comprises a backside facing the lid; and
the first electronic component has a metallization layer on the backside and contacting the thermal interface material.

4. The electronic device of claim 1, wherein:
the lid comprises a lid wall extending from a lateral end of the lid; and
the lid wall is coupled with the inner side of the substrate.

5. The electronic device of claim 1, further comprising:
a second electronic component over the inner side of the substrate and coupled with the conductive structure.

6. The electronic device of claim 5, wherein:
the lid comprises a lid top; and
the lid comprises a leg extending between the lid top and the inner side of the substrate between the first electronic component and the second electronic component.

7. The electronic device of claim 1, further comprising:
solder in the first hole and contacting the thermal interface material.

8. An electronic device, comprising:
a substrate comprising a dielectric structure and a conductive structure and having a top side;
an electronic component over the top side of the substrate and coupled with the conductive structure;
a metallization layer on a backside of the electronic component;
a stiffener coupled with the top side of the substrate;
a lid over the top side of the substrate and coupled with the stiffener, wherein the lid comprises a hole located over the electronic component;
a first thermal interface material between the lid and the electronic component;
a heat sink over the lid; and
a second thermal interface material between the lid and the heat sink;
wherein the second thermal interface material covers the hole.

9. The electronic device of claim 8, wherein the stiffener comprises:
an outer stiffener at an outer periphery of the substrate; and
an inner stiffener at an inner periphery of the substrate between the electronic component and the outer stiffener.

10. An electronic device, comprising:
a substrate comprising a conductive structure and an inner side and an outer side;
a first electronic component over the inner side of the substrate and coupled with the conductive structure;
a lid over the substrate and the first electronic component and comprising a first hole in the lid;
a thermal interface material between the first electronic component and the lid; and
solder in the first hole and contacting the thermal interface material.

11. The electronic device of claim 10, wherein:
the first electronic component comprises a backside facing the lid; and
the first electronic component has a metallization layer on the backside and contacting the thermal interface material.

12. The electronic device of claim 10, wherein:
the lid comprises a lid wall extending from a lateral end of the lid; and
the lid wall is coupled with the inner side of the substrate.

13. The electronic device of claim 10, further comprising:
a second electronic component over the inner side of the substrate and coupled with the conductive structure.

14. The electronic device of claim 13, wherein:
the lid comprises a lid top; and
the lid comprises a leg extending between the lid top and the inner side of the substrate between the first electronic component and the second electronic component.

* * * * *